US007635641B2

(12) United States Patent
Hurwitz et al.

(10) Patent No.: US 7,635,641 B2
(45) Date of Patent: Dec. 22, 2009

(54) INTEGRATED CIRCUIT SUPPORT STRUCTURES AND THEIR FABRICATION

(75) Inventors: Dror Hurwitz, Gilboa (IL); Mardechay Farkash, Haifa (IL); Eva Igner, Haifa (IL); Amit Zeidler, Kiryat Tivon (IL); Boris Statnikov, Nazerth Illit (IL); Benny Michaeli, Nazareth Illit (IL)

(73) Assignee: Amitec-Advanced Multilayer Interconnect Technologies Ltd., Migdal Harmek (IL)

( * ) Notice: Subject to any disclaimer, the term of this patent is extended or adjusted under 35 U.S.C. 154(b) by 545 days.

(21) Appl. No.: 11/250,421

(22) Filed: Oct. 17, 2005

(65) Prior Publication Data

US 2007/0082501 A1      Apr. 12, 2007

(30) Foreign Application Priority Data

Oct. 11, 2005     (IL) ...................................... 171378

(51) Int. Cl.
*H01L 21/44* (2006.01)
(52) U.S. Cl. ..................................................... 438/612
(58) Field of Classification Search ........................ None
See application file for complete search history.

(56) References Cited

U.S. PATENT DOCUMENTS

2004/0021222 A1* 2/2004 Mori ........................... 257/758
2004/0227227 A1* 11/2004 Imanaka et al. ............. 257/700
2005/0100720 A1* 5/2005 Shirai et al. ................. 428/209

* cited by examiner

Primary Examiner—Charles D Garber
Assistant Examiner—André C Stevenson
(74) Attorney, Agent, or Firm—Dennison, Schultz & MacDonald

(57) ABSTRACT

A method of fabricating an electronic substrate comprising the steps of; (A) selecting a first base layer; (B) depositing a first etchant resistant barrier layer onto the first base layer; (C) building up a first half stack of alternating conductive layers and insulating layers, the conductive layers being interconnected by vias through the insulating layers; (D) applying a second base layer onto the first half stack; (F) applying a protective coating of photoresist to the second base layer; (F) etching away the first base layer; (G) removing the protective coating of photoresist; (H) removing the first etchant resistant barrier layer; (I) building up a second half stack of alternating conductive layers and insulating layers, the conductive layers being interconnected by vias through the insulating layers, wherein the second half stack has a substantially symmetrical lay up to the first half stack; (J) applying an insulating layer onto the second hall stack of alternating conductive layers and insulating layers, (K) removing the second base layer, and (L) terminating the substrate by exposing ends of vias on outer surfaces of the stack and applying terminations thereto.

37 Claims, 33 Drawing Sheets

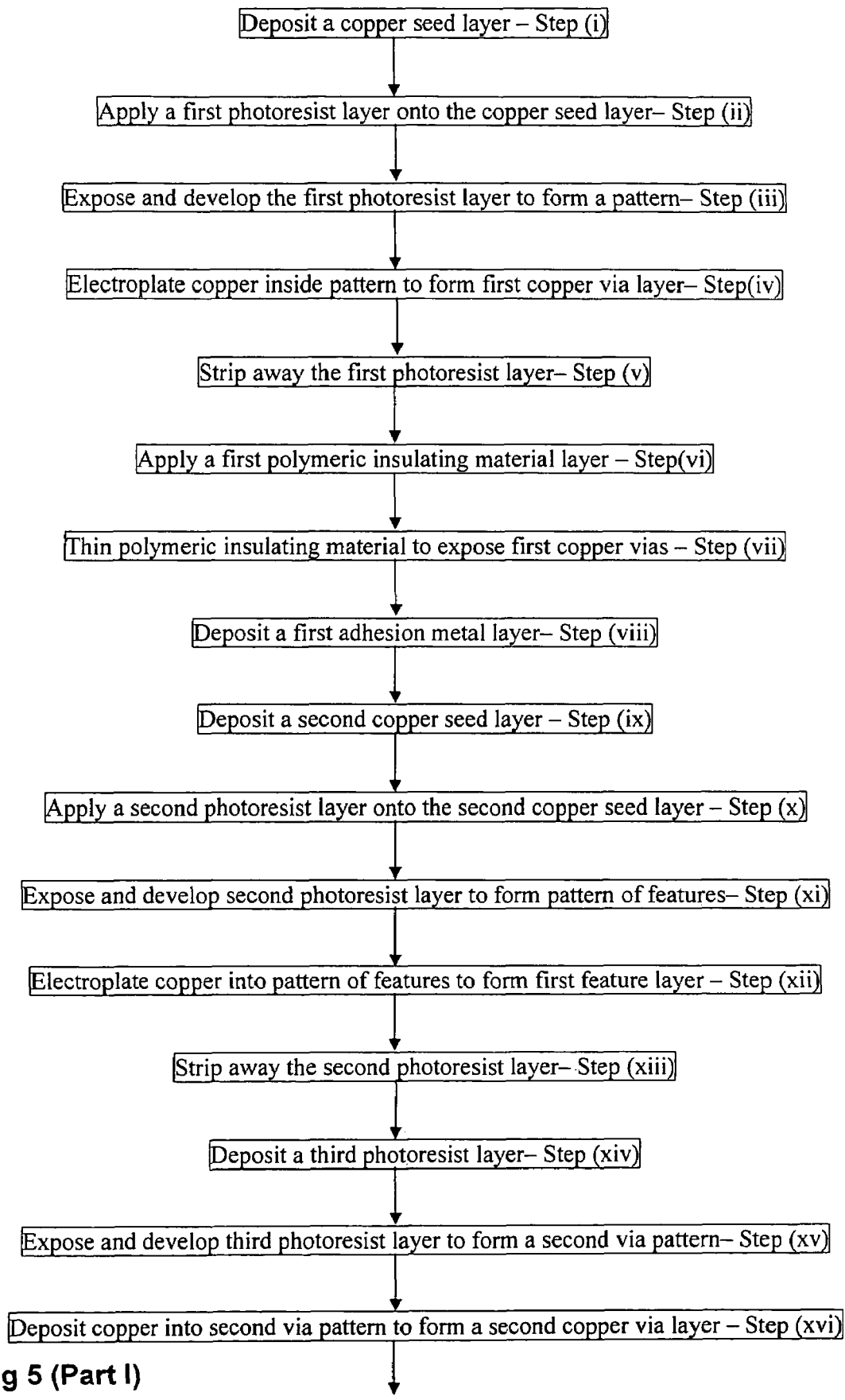
Fig 5 (Part I)

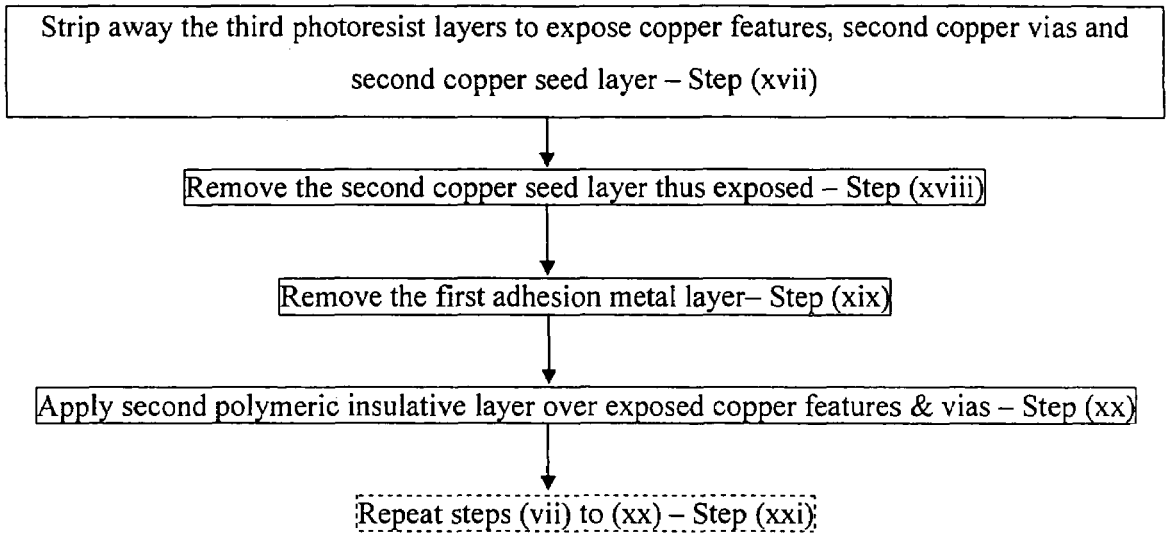
Fig 5 (Part II)

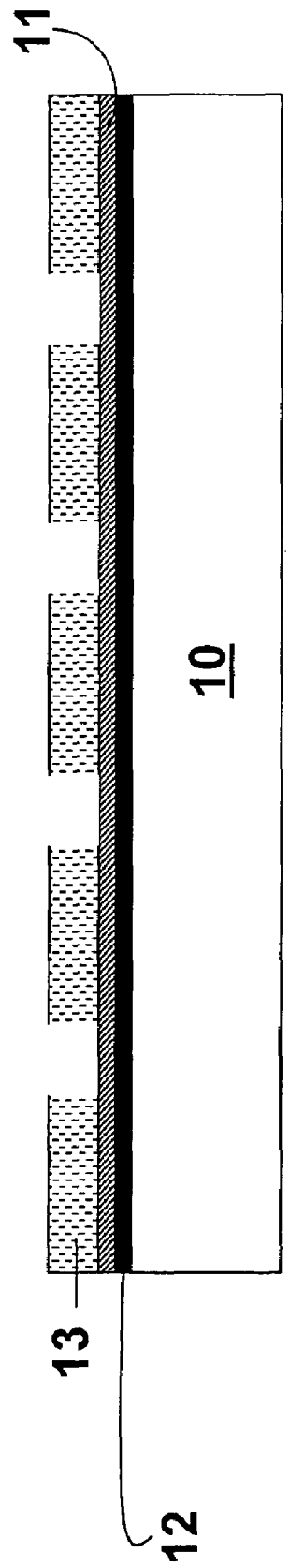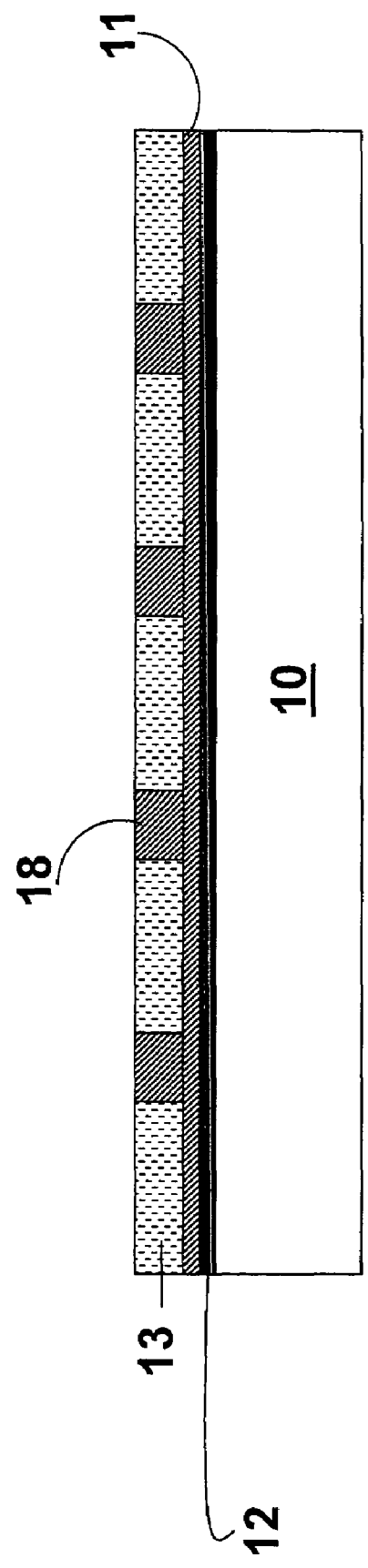

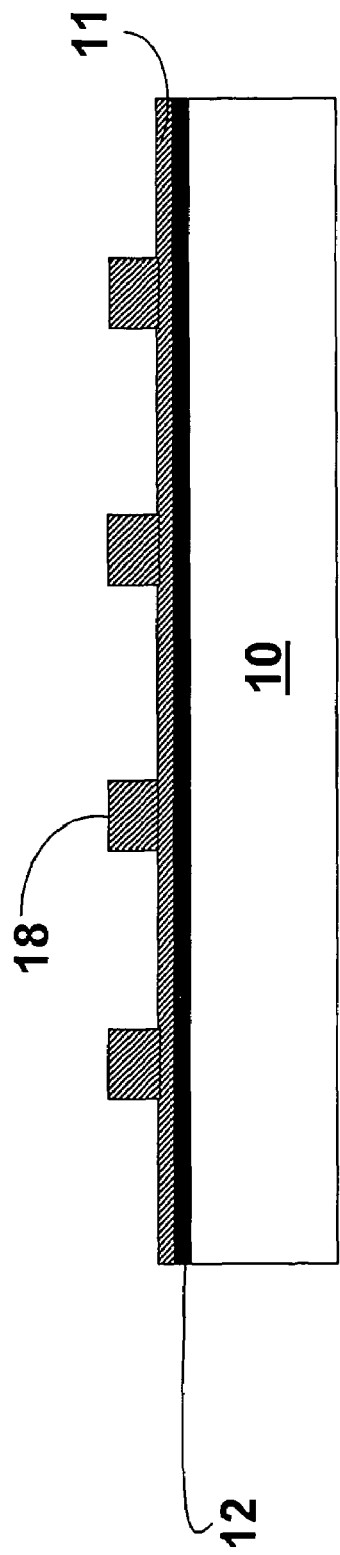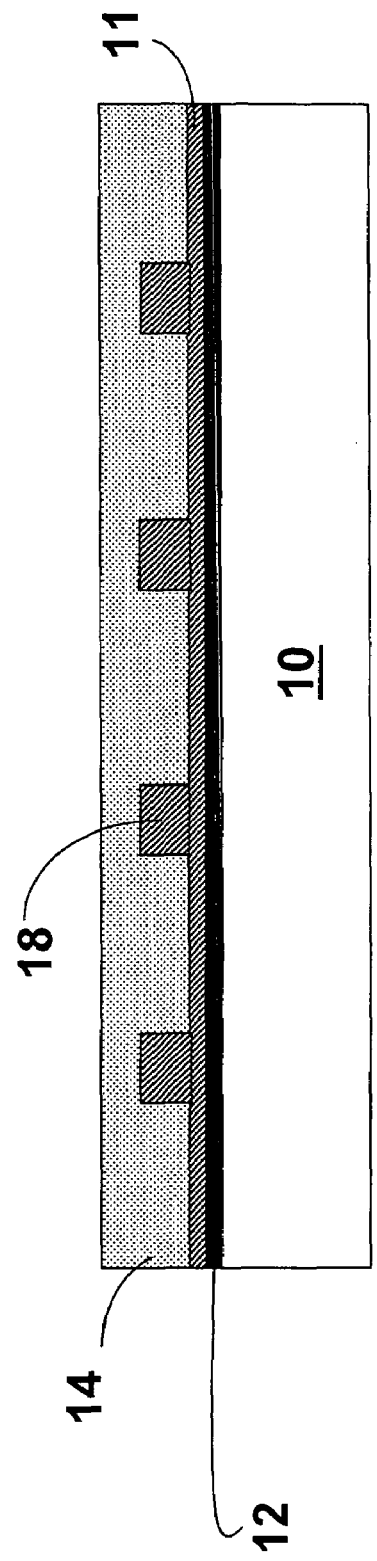
Fig. 5(v)
Fig. 5(vi)

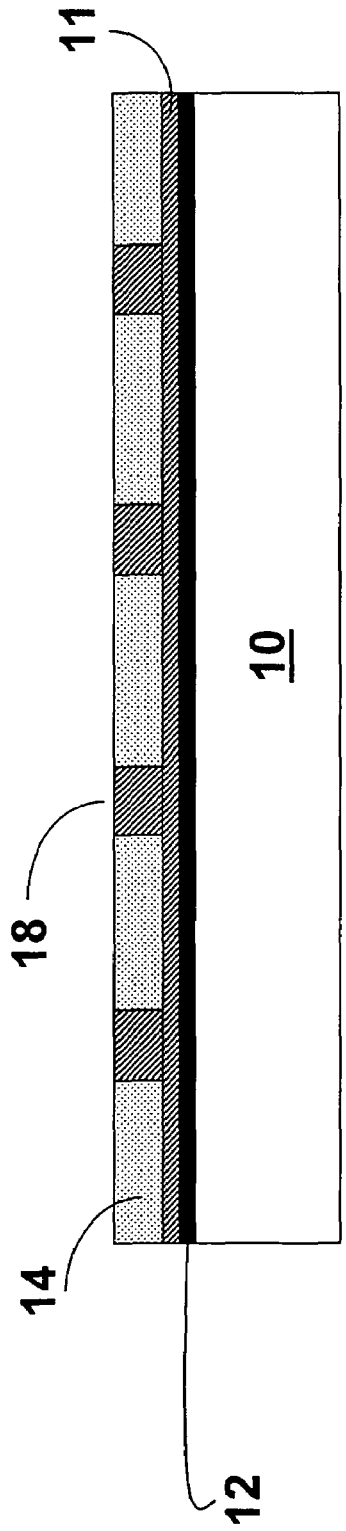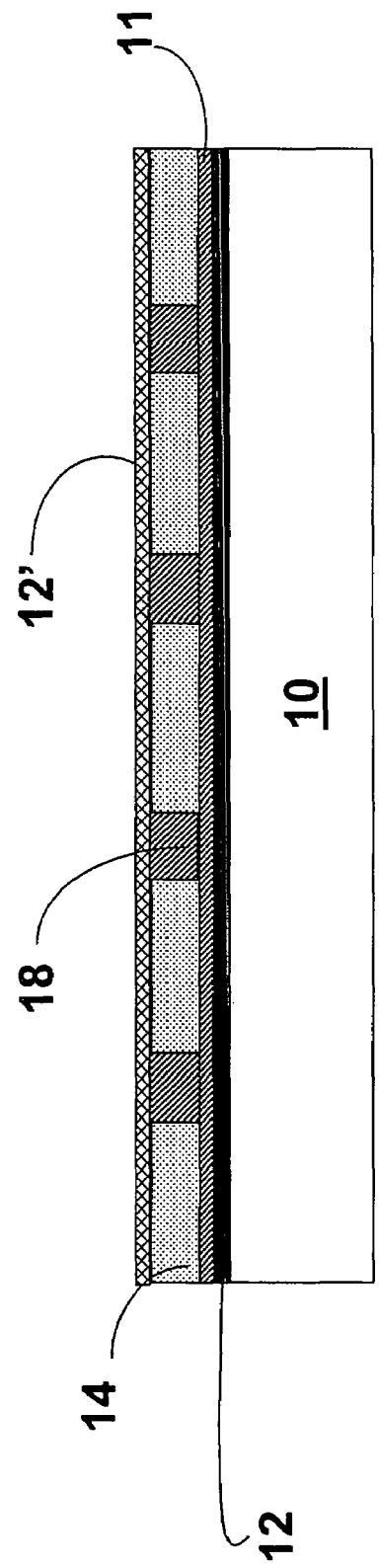

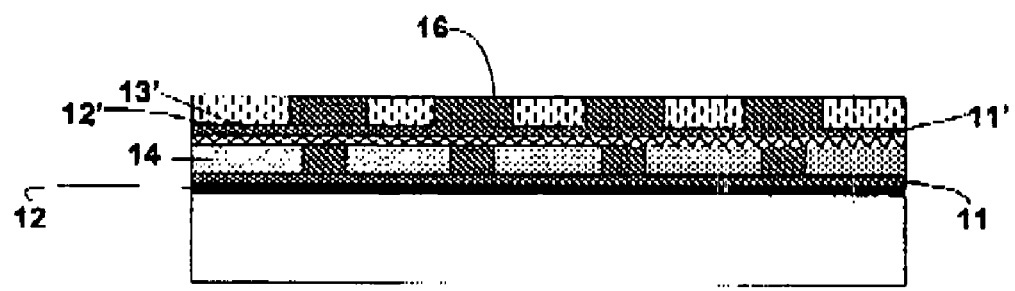
Fig. 5(xii)

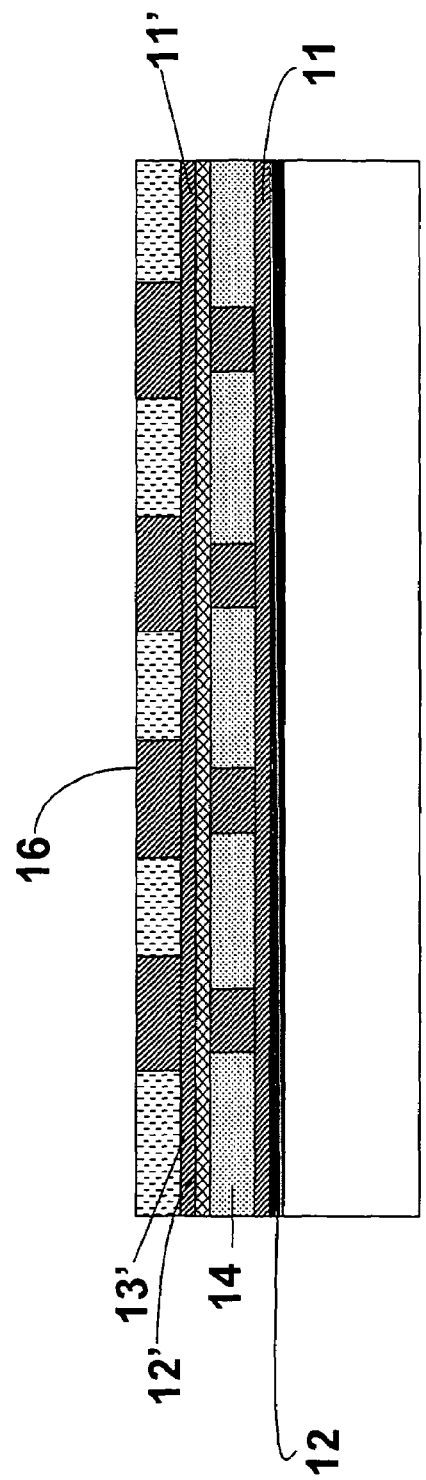
Fig. 5(xii)

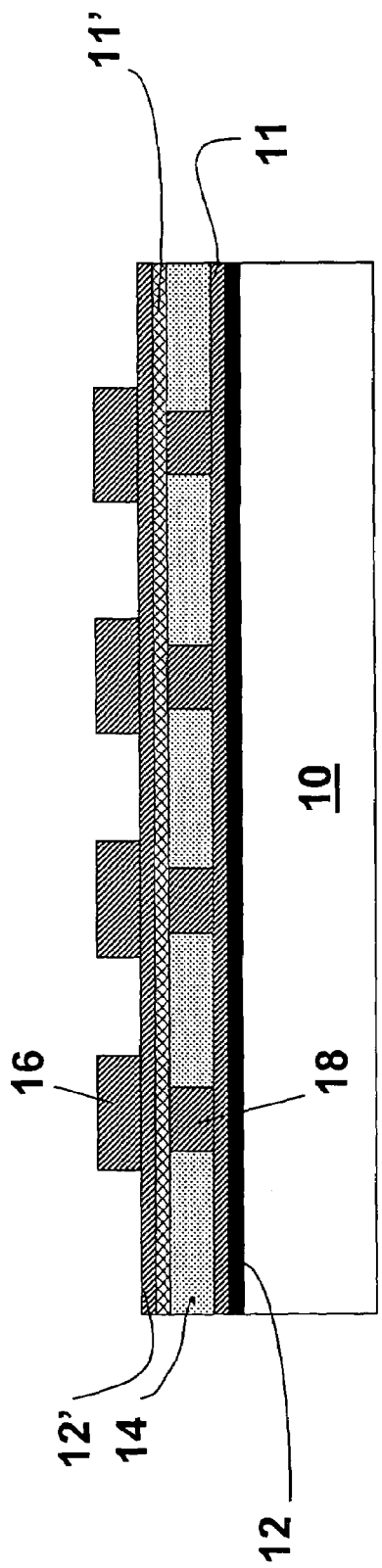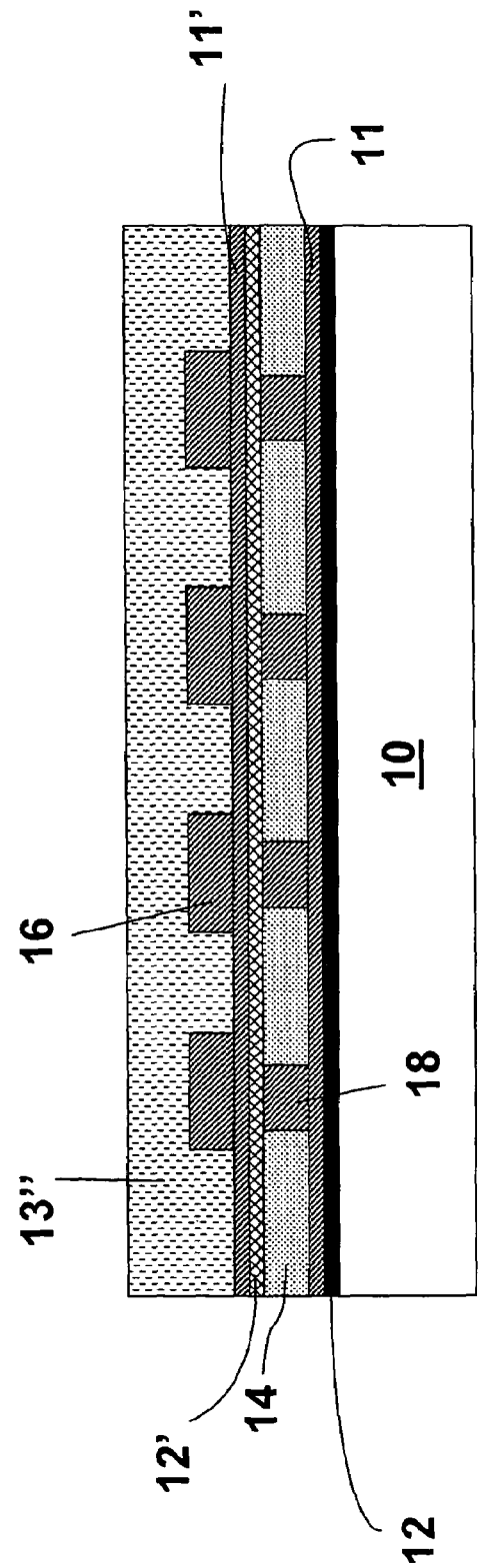

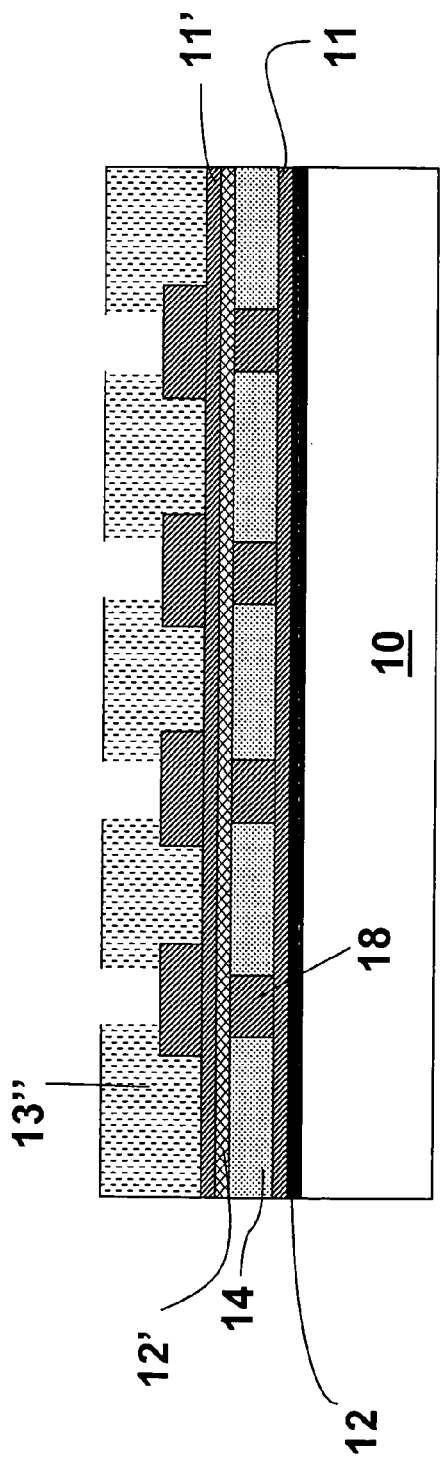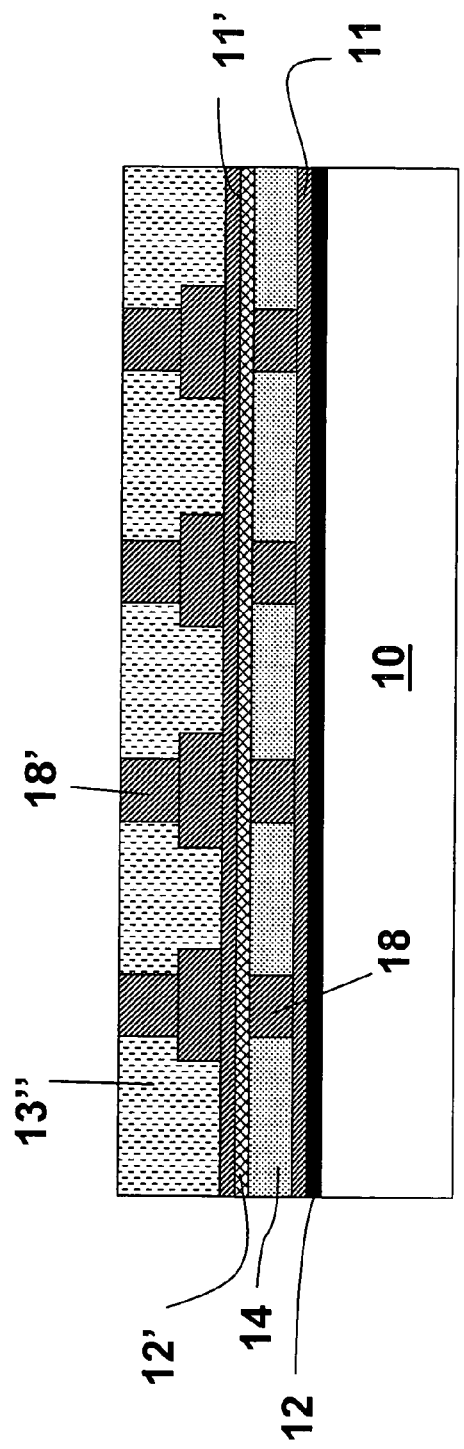

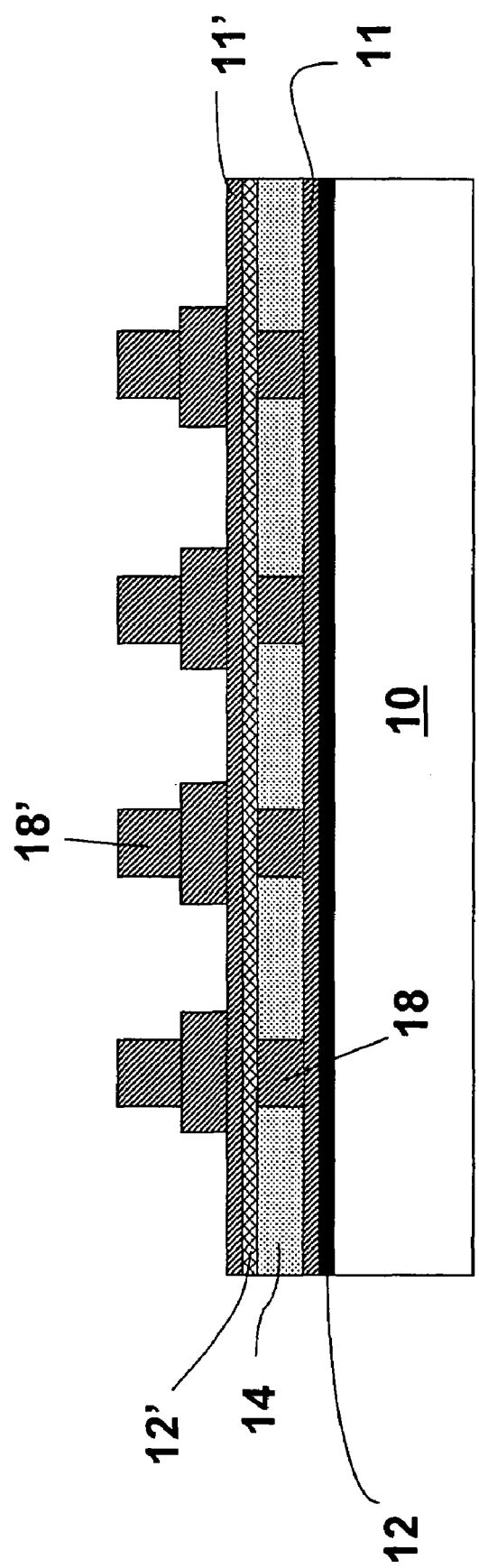
Fig. 5(xvii)

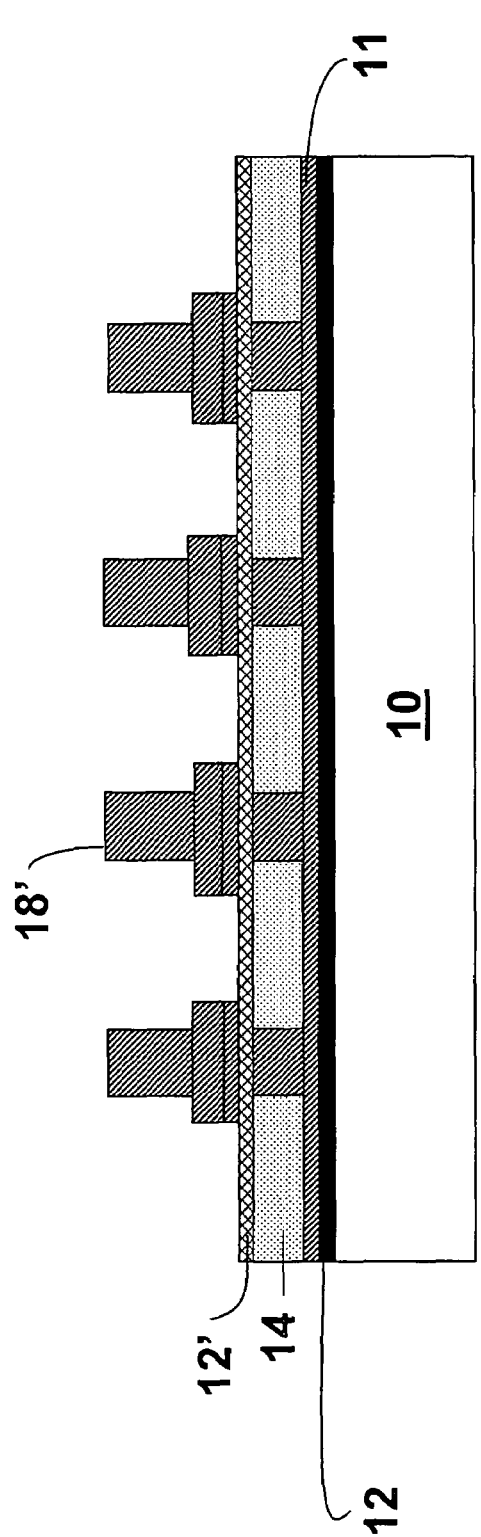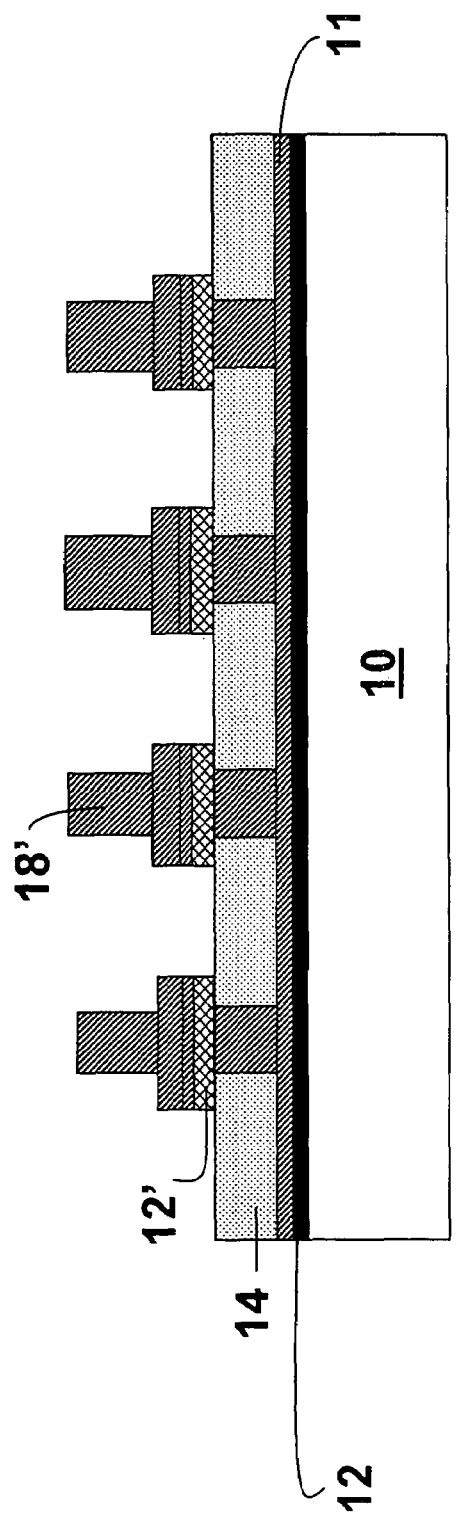

INTEGRATED CIRCUIT SUPPORT STRUCTURES AND THEIR FABRICATION

FIELD OF THE INVENTION

The present invention is directed to providing a support structure for integrated circuits, and to methods for the manufacture thereof.

BACKGROUND

There is a trend towards ever increasing complexity and ever greater miniaturization in the electronics industry. Space is at a premium, particularly in mobile equipment such as cellular phones and portable computers.

integrated Circuits (ICs) are the heart of these electronic systems. As such, ICs are becoming more and more complex, and include ever larger numbers of transistors, requiring increasing numbers of input/output contacts. They are required to operate at ever increasing switching speeds and frequencies, have ever increasing power consumptions and consequently generate ever increasing amounts of heat that requires dissipation.

ICs are connected to power supplies, user interfaces and other components via printed circuit boards (PCBs). To facilitate the connection of the IC to the PCB, it is necessary to provide a plurality of electronic connections. A common solution that has been adopted in order to interconnect the IC aid its related PCB involves the usage of an Electronic Substrate. The Electronic Substrate is part of the IC package and replaces the traditional lead-frame as an interposer between the IC and the PCB. Such a substrate may include one, two or many conductor layers isolated by a variety of dielectric material layers, such as ceramic or organic materials. Such substrates generally have conductive arrays of contacts on their undersides. These may be ball contacts, providing a so called a BGA (Ball Grid Array), or pins, providing a so-called PGA (Pin Grid Array) for electrical interconnection to the PCB. Alternatively, such substrates may be placed directly onto the PCB, without using balls or pins, providing a so-called LGA, (Land Grid Array) thereby. On its top side, the substrate will generally carry one or more ICs electrically connected thereto by the so-called Wire Bond or by the Flip Chip assembly techniques.

With reference to FIG 1, an example of a Wire Bond BGA package of the prior art is shown, having a substrate 100; a ball grid array (BGA) of electrically conductive balls 102 that connects the pads 104 on the underside of the substrate 100 to a PCB therebeneath (not show), and an array of electrically conductive wires, known as wire bonds 106, that connect the top side pads 108 of the substrate 100 to the IC 110. The IC 110 of such a package will usually be protected by a resinous material 112 that is otherwise known as a "molding" material.

With reference to FIG. 2, an example of a Flip Chip BGA package of the prior art is shown, having a Flip chip BGA substrate 200. Once again, a ball grid array (BGA) 202 of electrically conductive balls is provided, that connects the pads 204 on the underside of the substrate 200 to the PCB therebeneath (not shown). Instead of wire bonds however, electrically conductive bumps 206 are provided on the top side pads 208 of the substrate 200, for connecting to the IC 210, by what is known in the art us the Flip Chip process. This process also involves the application of a resin material 212 between the IC 210 and the surface of the substrate 200. In this technology, the resin 212 is generally known as an "under-fill" material. The resin under-fill 212 acts as a stress buffer, and reduces the fatigue on the IC 210 and the bumps 206 during thermal cycling over the Life time of the package 250. Sometimes the Flip Chip package 250 also includes a metal stiffener 214, which is attached to the substrate 200 by an adhesive layer 216, and a lid 220 that is attached to the back of the IC 210 with a thermal adhesive layer 222. The stiffener 214 is used to further stiffen the substrate 200 and helps maintain flatness during subsequent IC assembly processes, while the lid 220 helps dissipate the heat generated by the IC 210 during its operation.

The advanced BGA, PGA, LGA substrates used in Wire Bond and Flip Chip processes described hereinabove and illustrated in FIGS. 1 and 2 respectively, generally include two main sections; a so-called "core section" and a "built-up section" that is applied layer by layer thereupon.

With reference to FIG. 3, a detailed example of a typical organic Flip Chip BGA (FCBGA) substrate 300 is shown. The core section. 330 of the substrate 300 is constructed out of multiple copper conductor layers 332 that are usually separated by fiber-glass reinforced, organic dielectric material layers 334. The copper conductor layers 332 in the core 330 are electrically connected by Plated Through Holes (henceforth PTII) 336. Generally, in the process of forming the substrate 300, the core section 330 is formed first. PTIIs 336 are then formed by mechanically drilling holes, copper plating them and plugging. Next, external copper conductor layers 338 of the core section 330 are constructed. Two built-up suctions 340', 340" are then added, one on each side of the core 300. These built-up sections 340', 340" consist of a plurality of conductor copper layers 342, separated from each other by layers 344 of dielectric material, which may be reinforced by fiber-glass. The dielectric layers 344 contain copper plated micro-vias 346, which interconnect between adjacent copper conductor layers. The micro-vias 346 are usually laser drilled and hence are much smaller in diameter than the PTIIs 336. This releases valuable space on the substrate's built up sections for applying ICs thereupon. The improved mechanical and electrical characteristics of the dielectrics used in the built-up sections, together with their higher conductor densities, enabled by the usage of the micro-vias 346, allow them, eventually, to reach the density of the IC contacts and to act as intermediating contacts to the PCB.

It will be noted that the core section 330 of such an FCBGA substrate 300 primarily serves as a through interconnect "carrier" for the build-up sections 340', 340", whilst also accommodating the low density power and ground copper conductor layers required to operate the IC.

Due to their liner I/O pitches, modern ICs require very flat non-warped substrates to ensure the reliability of the package. This is difficult to achieve if the built-up section of the substrate is only formed on one side of the core. In order to create a flat, non-warped substrate during IC assembly processes and thereafter, the built-up sections are preferably built up on both sides of the core, so that a symmetrical structure is fabricated, resulting in a stress-balanced, flat substrate.

There is a cost to building up layers on both sides of the core however. It adds more manufacturing process steps which increases fabrication costs. Since the resulting substrate structure is more complicated, manufacturing yields drop off. Furthermore, the substrate thickness is increased, resulting in less compact, thicker packages that are less desirable for mobile communication and other applications where miniaturization is required. Additionally, it will be appreciated that the thicker the substrate, the greater the total inductance and thermal impedance of the package. This deteriorates the over-all performance of the IC. In view of these drawbacks, many attempts have been made to improve on the sandwich structure described above.

One development that attempts to minimize thickness is to construct the substrate without a central core, providing what is known in the art as a "core-less substrate". In this concept both the central core and the build-up section from the substrate's BGA (or PGA or LGA) side are eliminated, so that the entire substrate consists of one build-up section only, for interconnecting the IC to the PCB. The total substrate thickness is thereby significantly reduced, improving both its thermal impedance and its electrical performance. Furthermore, eliminating the core section of the substrate cuts down the cycle time of the manufacturing process and eliminates the need for mechanically drilled. PTHs which are fairly expensive to fabricate.

United States Published Patent Application Number USSN 2002/0001937 to Kikuchi et al. addresses the above issues by describing the manufacturing of multilayer interconnect structures consisting of polymeric insulating layers and metal interconnects on a metal base plate that is subsequently partially removed to create a metal supporting stiffener having an aperture for the IC. While the above referenced publication apparently introduces a viable methodology for obtaining a core-less substrate, it nevertheless suffers from a number of drawbacks. Firstly, all the conductor layers of the substrate require expensive thin film interconnects. While such thin film interconnect conductor layers provide better performance due to their improved densities and finer pitches, they are inappropriate to the substrate's power and ground metal planes which are usually low in density and pitch, and building them using expensive thin film technology is cost prohibitive. Secondly, these layers usually require a certain metal thickness to reduce electrical resistance and to prevent overheating. This can become difficult to achieve when using thin film processing techniques. Thirdly, the Flip Chip bonding process applies a pressure which thin (film interconnect structures are ill equipped to withstand. Such pressures tend to distort and/or stretch the interconnect structure, which in thin films are typically less then 100 microns thick, and sometimes cause cracking of the thin film dielectric layers which may lead to operating failure of the IC. Fourthly, it will be appreciated that the presence of a metal stiffener adjacent to the IC consumes valuable space on the external surface of the substrate and may limit usage in applications requiring passive components, such as decoupling capacitors, in close proximity to the IC. Fifthly, the large aperture metal stiffener used may make this technology unsuitable for applications requiring, for example, multi chip substrates, low body-sized substrates, substrates supplied, for IC assembly, in two dimensional matrix arrays or in strip formats.

U.S. Pat. No. 6,872,589 to Strandberg describes a substrate for mounting an IC. Here again, the substrate structure is formed on a metal carrier base which is only partially etched away, leaving a metal stiffener having an aperture for the mounted IC. Although Strandberg's substrate described in U.S. Pat. No. 6,872,589 may be advantageous over that described in USSN 2002/0001937, by offering a lower interconnect layer count. Nevertheless, it still suffers from all the drawbacks of the structure of USSN 2002/0001937 as detailed above.

In light of the above it is clear that there is still a need for cost-effective, higher performance core-less substrates that can be used in a wide range of applications. To satisfy this need, one promising approach has been to attempt to eliminate the expensive thin film build-up structures described above and to replace them with other, cheaper materials and processes such as those established by and in common use in the printed circuit board (PCB) fabrication industry. Unlike thin film dielectric materials, the advanced dielectric materials used in the PCB industry may be applied by lamination techniques and are available in the form of prepregs which may be reinforced with glass fibers or other reinforcement materials. Proper selection of these dielectrics provides the potential to introduce "self supported" core-less substrate structures that eliminate or at least minimize the need for metal stiffeners. Furthermore, use of relatively low cost, established, PCB oriented processes, is expected to provide cost effective core-less substrates having multiple, low density, low pitch power and ground metal layers combined with high density, fine pitch metal signal layers.

Such laminate structures have been found to be susceptible to warping, particularly in consequence of hot pressing or curing processes. Core-less substrates obtained thereby, typically lack the flatness required for securely and reliably mounting ICs thereupon.

Where such structures have been built up on one side of a metal carrier base that is subsequently removed prior to IC assembly, or thinned down to provide a stiffener supported substrate, internal unbalanced stresses invariably develop during fabrication. These stresses may he released on removal of the metal carrier, causing substrate curvature and warping. This can result in poor yields when assembling the IC thereupon, and may even lead to non flat packages that cannot then be mounted onto the corresponding PCB.

In an attempt to solve this issue, U.S. Pat. No. 6,913,814 to Ho et al. discloses a lamination process and resultant structure that provides a high density multi-layer substrate having a plurality of laminate layers, wherein each layer thereof is individually formed, and, only then are the layers stacked and laminated together. This approach apparently provides a viable alternative to the asymmetrical, sequentially built up, multi-layer substrates fabricated on a common metal carrier base of the prior art. The technology seems to provide a cost effective organic core-less substrate using tried and tested materials and processes established by the PCB fabrication industry, with solid copper vias replacing the PTHs, Nevertheless, the technology described in U.S. Pat. No. 6,913,814 to Ho et al. has two major drawbacks: Firstly, in order to construct a structure having a bottom layer with a low pitch BGA (hereupon for attachment to a PCB and a high pitch upper IC side, the substrate must be constructed from individual laminae, each having different densities and different dielectric layer thicknesses. Once again this results in an unbalanced, asymmetrical, structure with an inherent tendency to curving. Secondly, as is well known to those experienced in the art, connecting the substrate layers with via-to-pad contacts based upon metal contacts achieved through dielectric materials lamination is unreliable for high performance ICs applications, since these have a tendency towards loss of via contact and resultant package failures. This is especially of concern where high temperature processes are used during IC mounting onto the substrate.

Thus, despite the developments described above, there is still a need for manufacturing processes and chip support structures that overcome the disadvantages of the prior art, and that arc economical and particularly suitable for large scale manufacture, having high yield, and excellent reliability due to high levels of planarity and smoothness. The present invention addresses this need.

SUMMARY OF THE INVENTION

It is an aim of the invention to provide a novel manufacturing technique for multilayer interconnect support structures that is economical and is particularly suitable for large scale manufacture.

It is a further aim to provide a manufacturing technique that attains high yields.

It is a specific aim of the manufacturing technique to provide multilayer interconnect support structures having excellent planarity and smoothness.

It is further specific aim of the manufacturing technique to provide multilayer interconnect support structures having high reliability.

It is a specific object of preferred embodiments of the invention to provide a high performance core-less laminated substrate for an IC, that is low in thickness relative to substrates of the prior art, yet having multiple conductive power and ground metal layers and high density, fine pitch conductive signal layers that are electrically interconnected by solid copper vias and surrounded by insulating materials; the substrate being capable of passing electrical signals with minimum loss and providing minimum thermal impedance.

It is another specific object or preferred embodiments of the invention to provide a self-supported, flat, core-less laminated substrate that can accommodate ICs using Flip Chip assembly processes and/or Wire Bond assembly processes Preferably such a substrate can be supplied, prior to IC assembly, either in single unit format or in a multiple unit format such as in a matrix array or a strip array.

It is a further specific object of other preferred embodiments of the invention to provide a flat, core-less laminated substrate that is supported by a metal stiffener having an aperture with a relatively large opening in its center, for accommodating one or several ICs, with or without the addition of passive components such as decoupling capacitors.

In a first aspect, the present invention is directed to providing a method of fabricating an electronic substrate by building up a stack comprising the steps of:
(A) selecting a first base layer;
(B) depositing a first etchant resistant barrier layer onto said first base layer;
(C) building up a first half stack of alternating conductive layers and insulating layers, the conductive layers being interconnected by vias through the insulating layers;
(D) applying a second metal base layer onto said first half stack;
(E) applying a protective coating of photoresist to said second base layer;
(F) etching away said first base layer;
(G) removing the protective coating of photoresist;
(H) removing said first etchant resistant barrier layer;
(I) building up a second half stack of alternating conductive layers and insulating layers, the conductive layers being interconnected by vias through the insulating layers, wherein second half stack has a substantially symmetrical lay up to first half stack;
(J) applying an insulating layer onto said second half stack of alternating conductive layers and insulating layers, and
(K) removing said second base layer.

Typically the method further comprises the step (L) of terminating the substrate by exposing ends of vias on outer surfaces of the stack and applying terminations said ends of vias.

Optionally, the second base layer comprises a metal, and step (D) of applying a second base layer comprises applying an insulating polymeric layer onto a side of the second base layer, contacting the side of the second base layer with applied insulating polymeric layer thereon, to the first stack and hot press laminating the base layer to the first half stack.

The first base layer is typically fabricated from copper or a copper alloy, in which case step (F) of etching away first base layer is performed using a copper etchant.

Optionally, the barrier layer of step (B) is deposited to a thickness in the range of 0.1 micron to 1 micron and either: comprises a metal selected from the list of tantalum, tungsten, titanium, titanium-tantalum alloy, nickel, tin, lead, and tin-lead alloy, in which case the step of 'depositing' comprises sputtering, or alternatively, if the barrier comprises a metal selected from the list of nickel, tin, lead, and tin/lead alloy, 'depositing' may be by a process selected from the list of electroplating and electro-less plating.

The conductive layers and interconnecting vias typically comprise copper deposited using techniques selected from die list of electroplating and electroless plating.

Typically, step (F) of etching away first base layer uses a wet etch process, and the barrier layer fabricated in step (B), acts as an etch stop.

Optionally, the barrier layer fabricated in step (B) comprises tantalum and the etch process for step (F) of etching away first base layer comprises exposing the first base layer to a solution of ammonium hydroxide at an elevated temperature.

Optionally, where the barrier layer fabricated in step (B) comprises tantalum, titanium or tungsten, step (H) of removing first barrier layer comprises plasma etching using a mixture of $CF_4$ and argon, where the mixture typically has a $CF_4$ to argon ratio of between 1:1 and 3:1.

In one embodiment Step (C) comprises the sub-process (Alpha) of depositing a first layer of vias followed by sub-process (Bcta) of depositing a layer of features and depositing a layer of vias onto the layer of features.

Optionally sub-process alpha comprises the following sub-steps:
(i) depositing a seed layer of copper;
(ii) applying a first photoresist layer onto said seed layer;
(iii) exposing and developing said first photoresist layer to form a pattern;
(iv) pattern electroplating copper inside the pattern to form a first layer or solid copper vias;
(v) stripping away the first photoresist layer, and
(vi) applying a first layer of polymeric insulating material.
Optionally Sub-process Beta comprises the sub-steps of:
(vii) thinning down the layer of polymeric insulating material to expose first layer of copper vias;
(viii) depositing a first adhesion metal layer;
(ix) depositing a second copper seed layer;
(x) applying a second photoresist layer onto said second seed layer;
(xi) exposing and developing said second photoresist layer to form a pattern of features, and
(xii) pattern electroplating copper inside the pattern of features in second photoresist layer to form a first layer of solid copper features;
(xiii) stripping away the second photoresist layer;
(xiv) applying, a third layer of photoresist;
(xv) exposing and developing said third layer of photoresist to form a second pattern of vias;
(xvi) depositing copper into second pattern of vias to form a second layer of copper vias;
(xvii) stripping away third layer of photoresist and exposing said copper features, second layer of copper vias and second copper seed layer;
(xviii) removing said second copper seed layer thus exposed;
(xix) removing said first adhesion metal layer, and
(xx) applying a second layer of polymeric insulative material over the copper features and vias thus exposed.

Optionally, the second half stack comprises a first layer of vias followed by a first layer of features and a second layer of vias and step (I) comprises the sub-process (Alpha) of depositing a first layer of vias followed by sub-process (Beta) of depositing a first layer of features thereupon followed by a second layer of vias.

Thus step (I) comprises:
- (Iii) applying a first photoresist layer onto seed layer deposited in sub-step (i) of (C);
- (Iiii) exposing and developing said first photoresist layer to form a pattern;
- (Iiv) pattern electroplating copper inside the pattern to form a first layer of solid copper vias;
- (Iv) stripping away the first photoresist layer, and
- (Ivi) applying a first layer of polymeric insulating material.

Sub-process Beta comprises the sub-steps of:
- (Ivii) thinning down the layer of polymeric insulating material to expose first layer of copper vias;
- (Iviii) depositing a first adhesion metal layer;
- (Iix) depositing a second copper seed layer;
- (Ix) applying a second photoresist layer onto said second copper seed layer;
- (Ixi) exposing and developing said second photoresist layer to form a pattern of features;
- (Ixii) pattern electroplating copper inside the pattern of features in second photoresist layer to form a first layer of solid copper features
- (Ixiii) stripping away the second photoresist layer;
- (Ixiv) applying a third layer of photoresist;
- (Ixv) exposing and developing said third layer of photoresist, to form a second pattern of vias;
- (Ixvi) depositing copper into second pattern of vias to form a second layer of copper vias;
- (Ixvii) stripping away third layer of photoresist and exposing said copper features, second layer of copper vias and second copper seed layer;
- (Ixviii) removing said second copper seed layer thus exposed;
- (Ixix) removing said first adhesion metal layer, and
- (Ixx) applying a second layer of polymeric insulative material over the copper features and vias thus exposed.

In a second embodiment the first half stack is built up from a first layer of features, and step (C) starts from sub step (x) of applying a photoresist layer onto seed layer deposited in, sub-step (i) of (C).

In a third embodiment, the first half stack and second half stack comprise further layers that may be built up by stops (C) comprising further sub-step (xxi) of repeating steps (vii) to (xx), and step (I) comprising further sub-step (Ixxi) of repeating steps (Ivii) to (Ixx).

In further embodiments, steps (xxi) and (Ixxi) are repeated to build up desired structure.

Typically, polymeric insulating layer of (vi), (xx) and (Ivi) and (Ixx) comprises a matrix material comprising a polymeric resin selected from the list of thermoplastics, thermosets and mixtures thereof, such as Teflon, derivatives of Teflon, bismaleimide triazine resins, epoxy resins, polyimide resins and mixtures thereof, for example.

In preferred embodiments, the polymeric insulating layers of (vi), (xx) and (Ivi) and (Ixx) further comprises at least one of: (a) inorganic particulate fillers having mean particle size of between 0.5 microns and 5 microns and between 15% and 30% of particulate by weight; (b) fibers selected from the list of organic fibers and glass fibers, arranged in an arrangement selected from the list of cross-plied arrangements, woven mats and randomly oriented chopped fibers.

In most preferred embodiments, the insulative layer is provided as a prepreg that is applied over the solid copper and cured by a hot press lamination process.

Preferably, sub-steps (vii) and (Ivii) of thinning the insulative material to expose the solid copper therebeneath comprises: thinning by a process selected from the list of dry etching, mechanical grinding, chemical mechanical polishing (CMP), combinations and two stage processes thereof.

Preferably sub-steps (vii) and (Ivii) further comprise a post thinning cleaning to remove polymer smear from copper surface.

Preferably the adhesion metal layer of steps (viii) and (Iviii) is selected from the list of titanium, chrome and nickel/chrome alloy.

Optionally, the step (L) of applying termination layers to outer surfaces of the stacked structure may comprise the sub-steps of:
- (m) thinning substrate to expose the copper vias in outermost layers;
- (n) depositing outer adhesion metal layers onto exposed copper vias;
- (o) depositing outer copper seed layers onto the outer adhesion metal layers;
- (p) applying outer photoresist layers to the outer copper seed layers;
- (q) exposing and developing outer photoresist layers to provide a patterned structure;
- (r) depositing copper within the patterned structure to form copper conductors and pads,
- (s) stripping away the outer photoresist layers;
- (t) removing the outer adhesion layers and copper seed layers;
- (u) applying solder mask layers to both sides of the stack;
- (v) Selectively removing solder mask to expose copper pads, and
- (w) applying a final coating selected from the list of nickel, gold, tin, lead, silver, palladium and alloys or amalgams thereof and organic anti-tarnish finishes.

Alternatively, the step of applying termination layers to outer surfaces of the stacked structure comprises the sub-steps of:
- (m) thinning substrate to expose the copper vias in outermost layers;
- first; depositing an adhesion metal layer;
- second; depositing a copper Seed layer;
- third; building up a copper layer to a required thickness;
- fourth, applying and developing a further photoresist layer;
- fifth, etching away exposed copper;
- sixth, removing the outer adhesion layers and copper seed layers;
- seventh, stripping away the further photoresist layer;
- eighth, applying solder mask layers to both sides of the stack;
- ninth, selectively removing solder mask to expose copper pads, and
- tenth, applying a final coating selected from the list of nickel, gold, tin, lead, silver, palladium and alloys or amalgams thereof and organic aniti-tarnish finishes In a second aspect, the present invention is directed to providing an electronic substrate formed substantially by the method comprising the steps of;
- (A) selecting a first base layer;
- (B) depositing a first etchant resistant barrier layer onto said first base layer,
- (C) building up a first hall stack of alternating conductive layers and insulating layers, the conductive layers being interconnected by vias through the insulating layers;
- (D) applying a second metal base layer onto said first half stack;
- (E) applying a protective coating of photoresist to said second base layer;
- (F) etching away said first base layer;

(G) removing photoresist;
(H) removing said first etchant resistant barrier layer;
(I) building tip a second half stack of alternating conductive layers and insulating layers, the conductive layers being interconnected by vias through the insulating layers, wherein second half stack has a substantially symmetrical lay up to first half stack;
(J) applying an insulating layer onto said second half stack of alternating conductive layers and insulating layers;
(K) removing said second base layer, and
(L) applying terminations.

In a third aspect, the present invention is directed to providing an electronic substrate substantially comprising a multilayer, coreless laminate having a substantially symmetrical lay up of alternating conductive layers and insulative layers; the conductive layers comprising metallic material; the insulative layers comprising polymeric matrix materials; wherein solid metal vias are provided through the insulative layers to connect the conducting layers; the structure being substantially flat and free standing.

Typically, the electronic substrate has at least one of the following limitations: (I) the conducting layers are fabricated from copper and the insulative layers are fabricated from a polymeric matrix material; (II) at least one insulative layer further comprises between 15% and 30% by weight of particulate filler, and (III) at least one insulative layer further comprises fibers.

The electronic substrate may be configured as an interconnect structure for interconnecting an integrated Circuit with a printed circuit board.

For consistency, all thicknesses provided herein by way of example, are given in microns (μm).

BRIEF DESCRIPTION OF THE FIGURES

For a better understanding of the invention and to show how it may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary For a fundamental understanding of the invention; the description taken with the drawings making apparent to those skilled in the art how the several forms of the invention may be embodied in practice.

Figure 1:
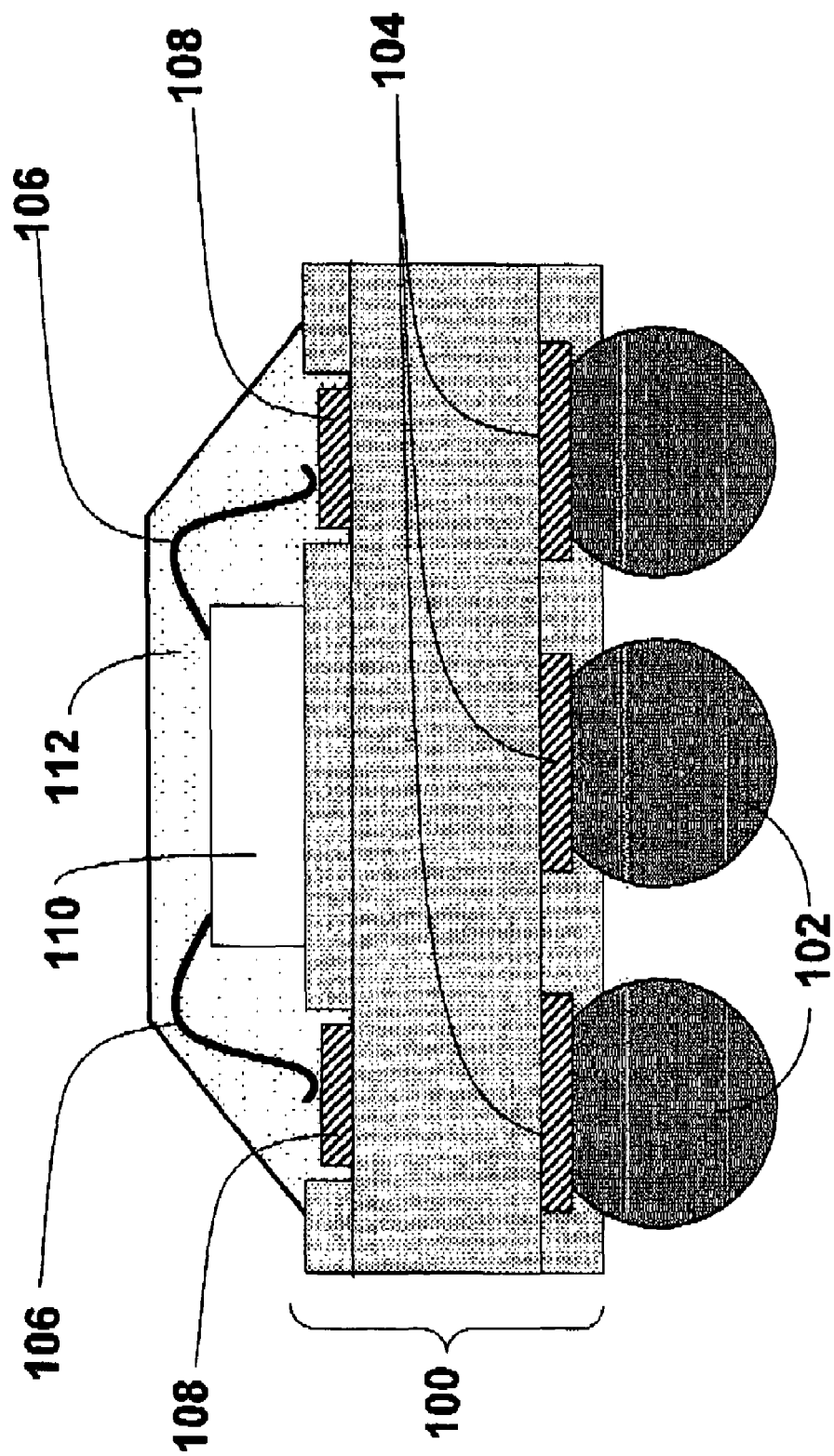
Figure 2:
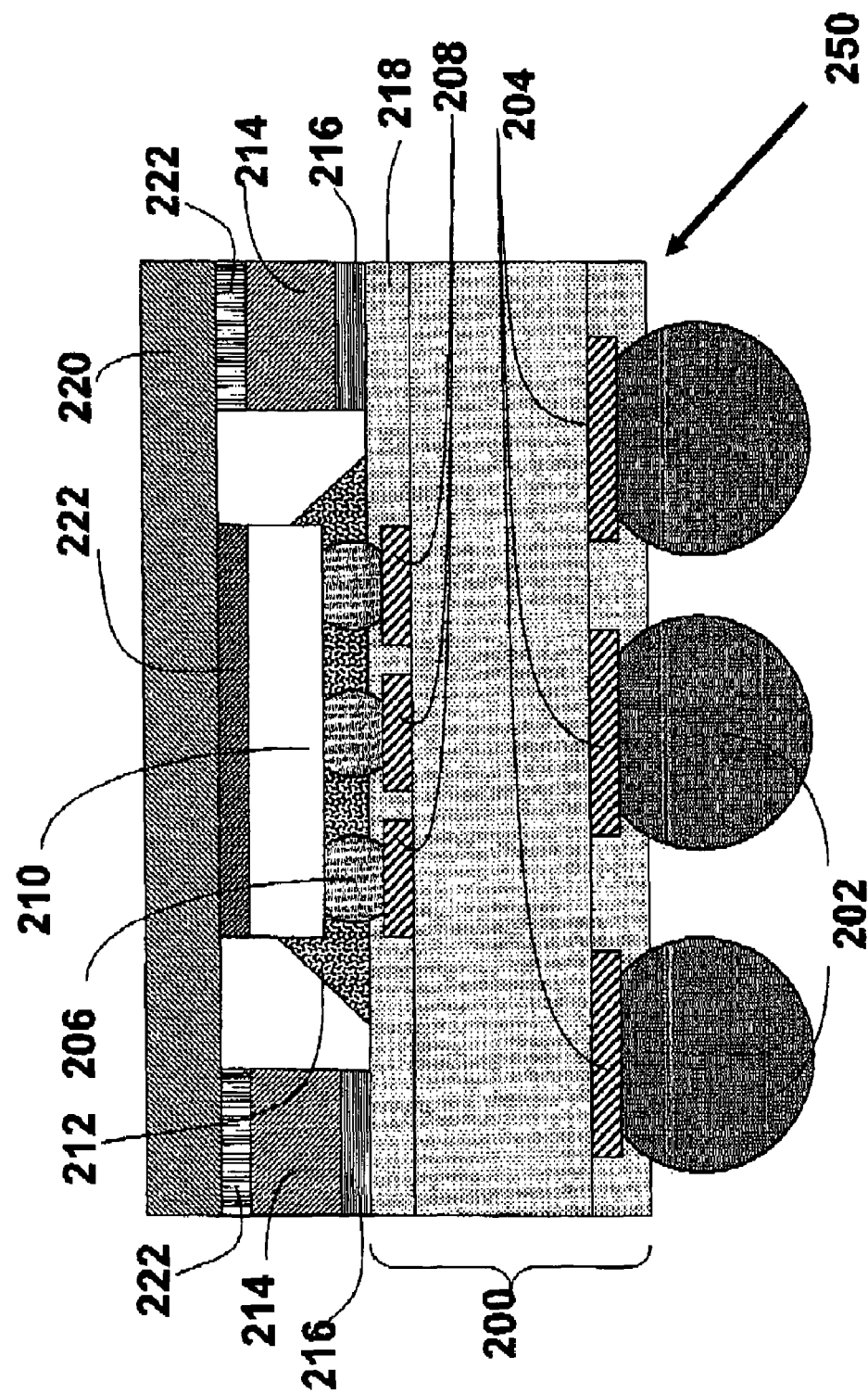
Figure 3:
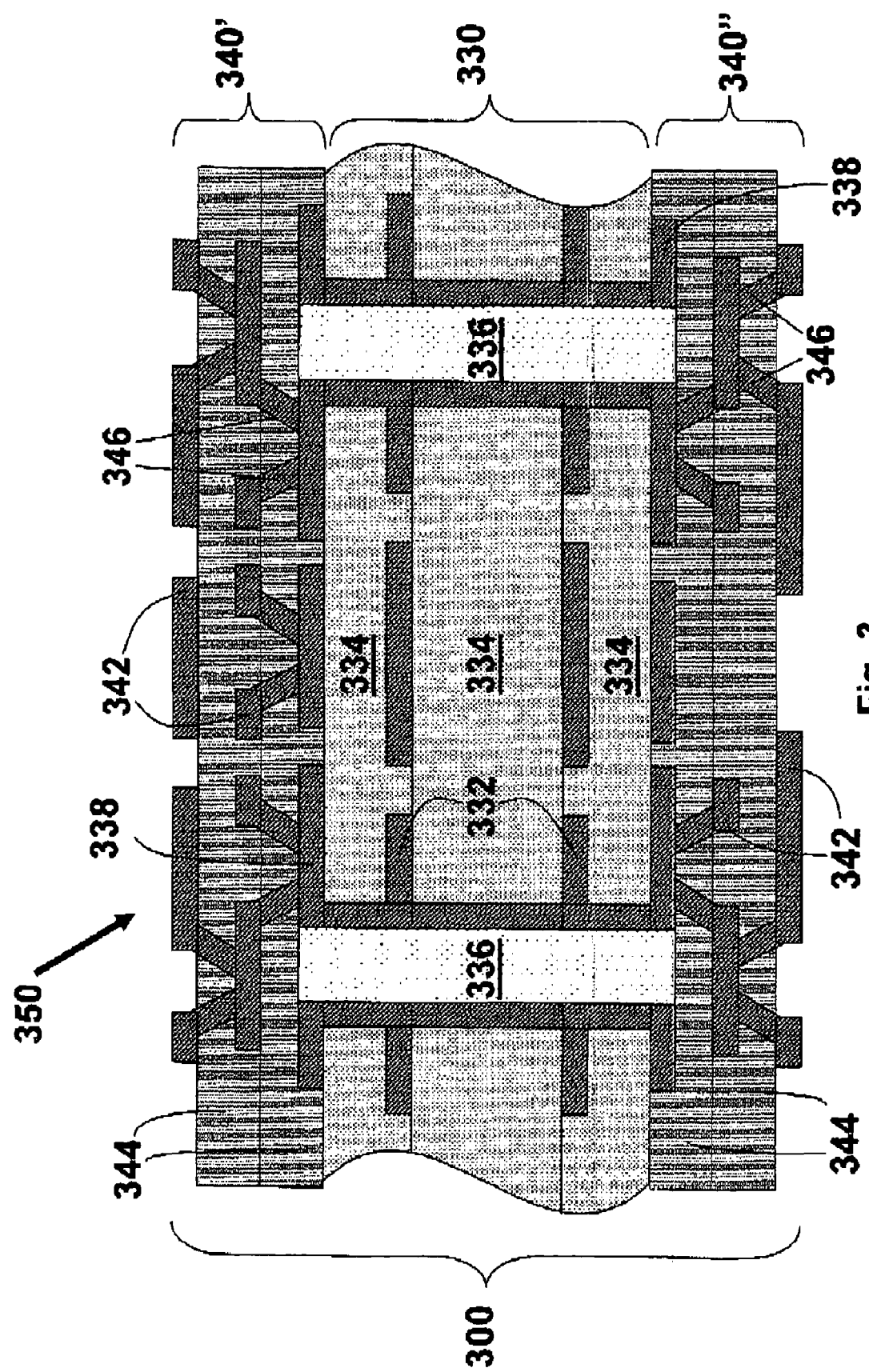
Figure 4:
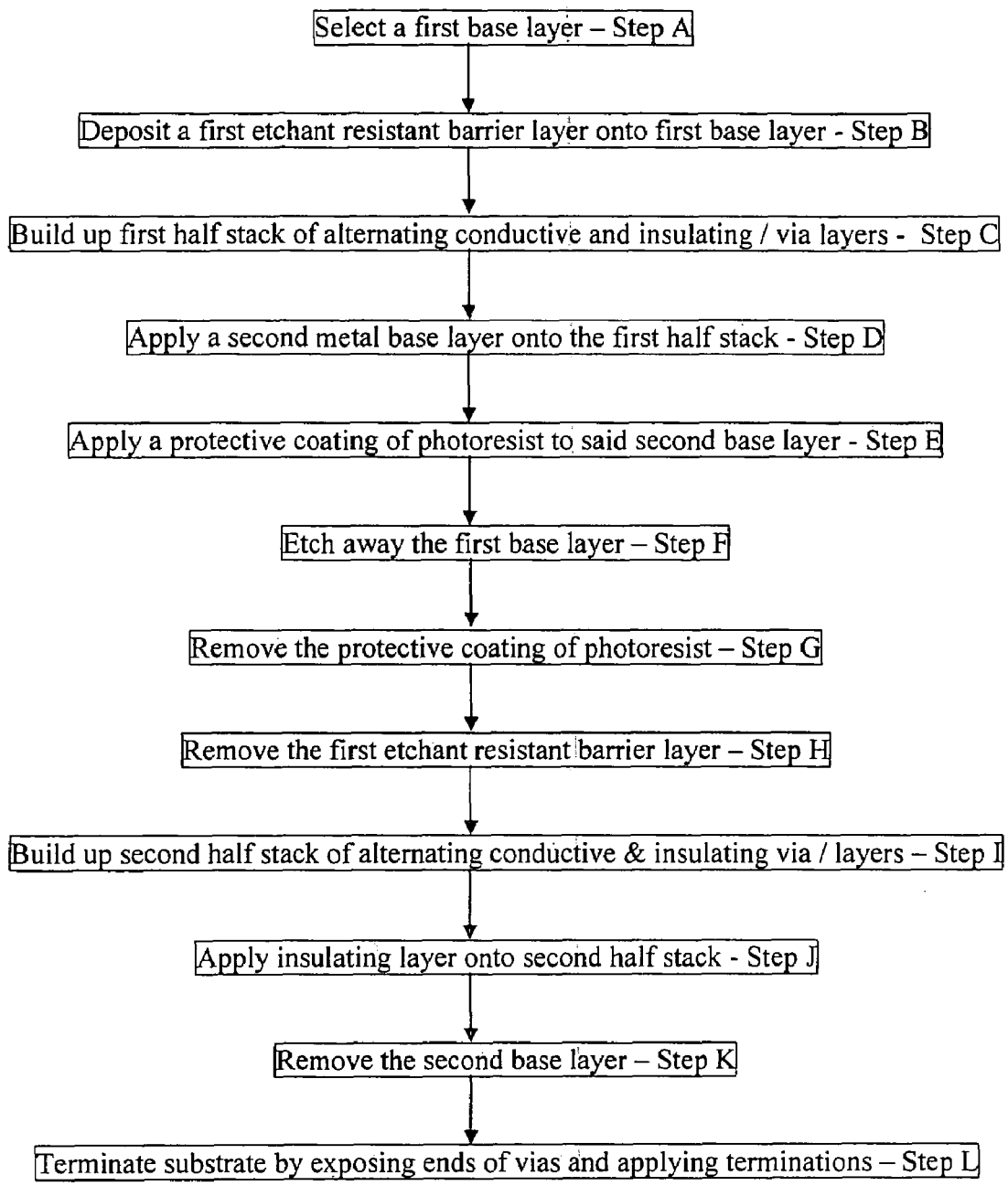
Figure 4A:
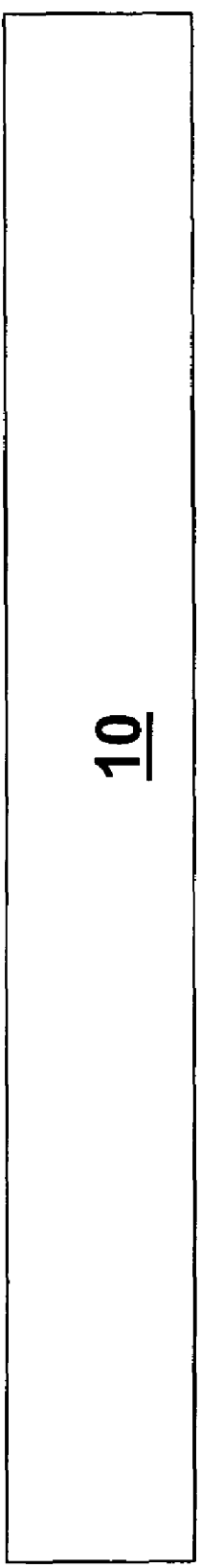
Figure 4B:
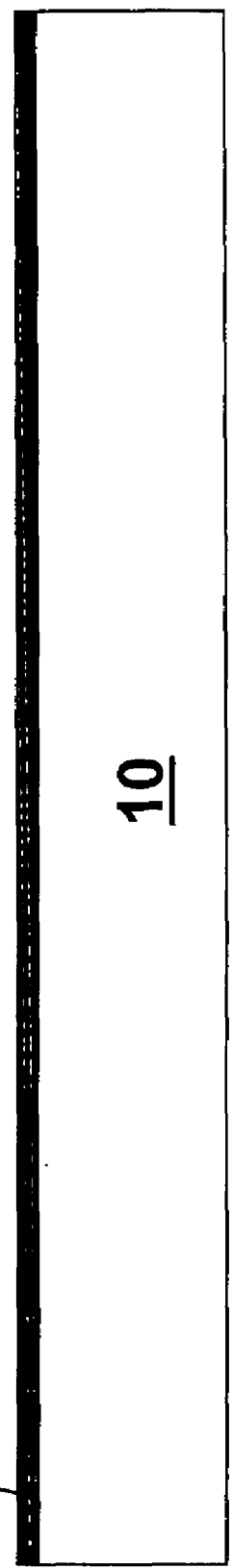
Figure 4C:
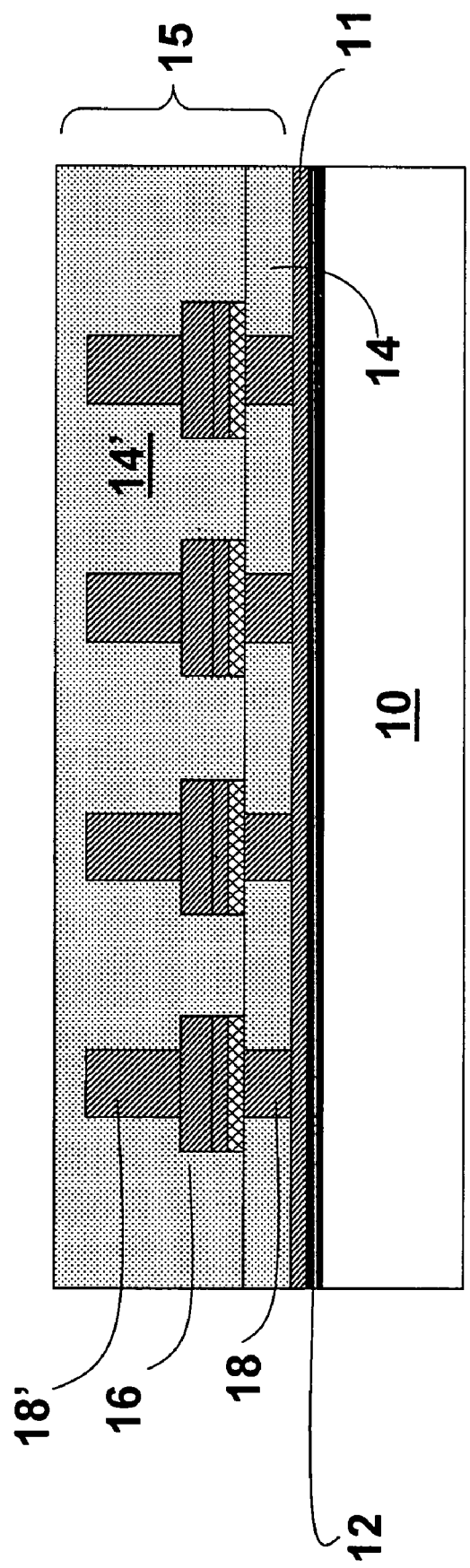
Figure 5I:
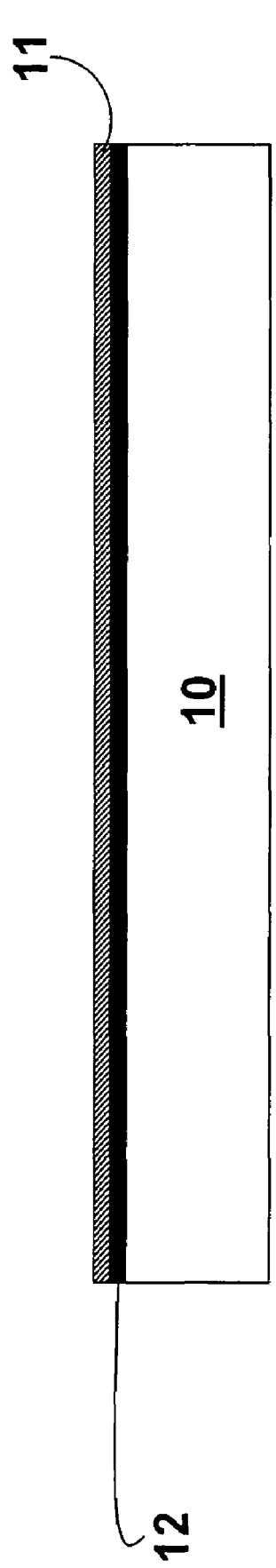
Figure 5:
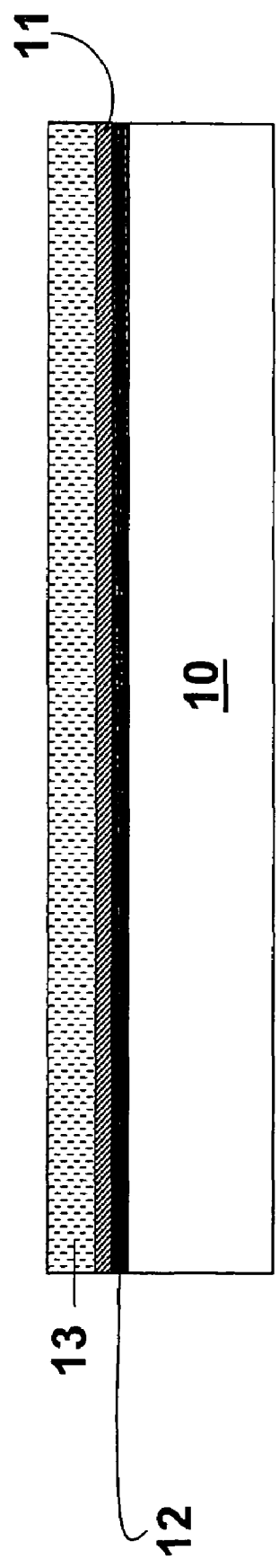
Figure 5:
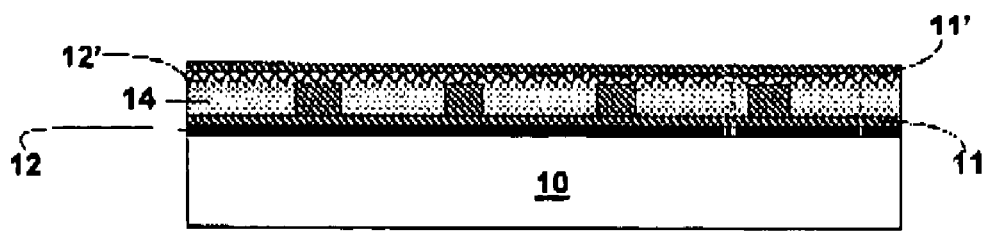
Figure 5X:
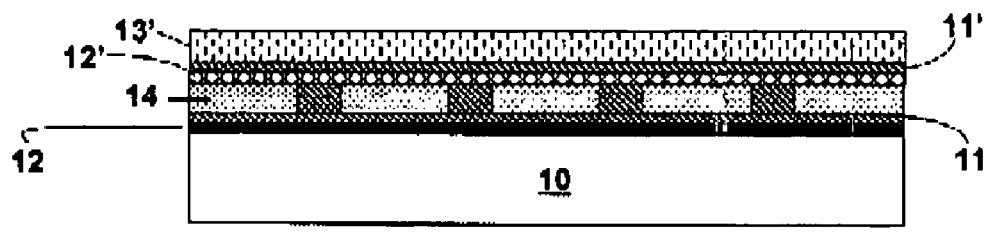
Figure 5:
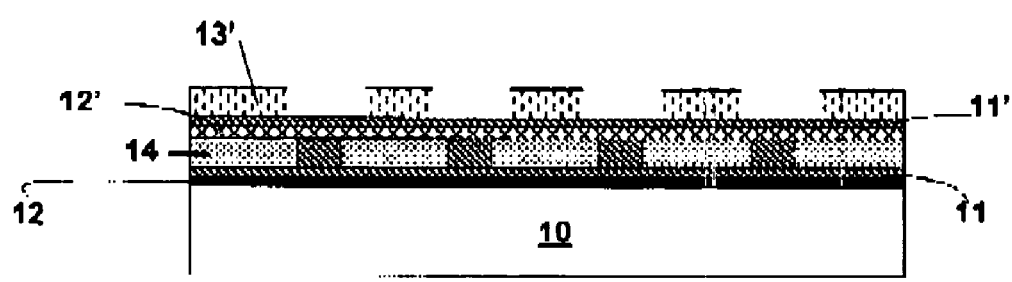
Figure 5:
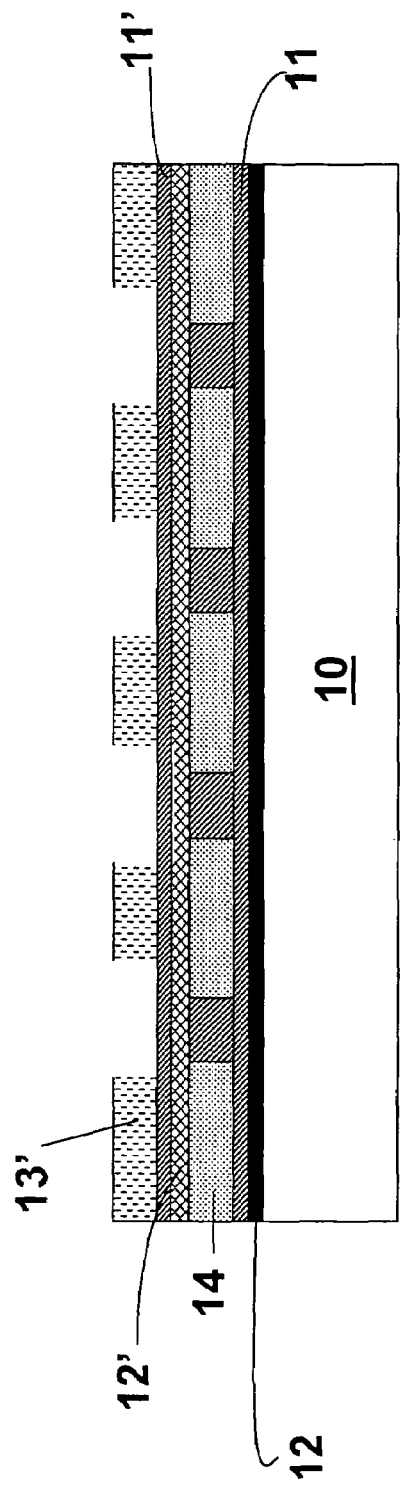
Figure 5:
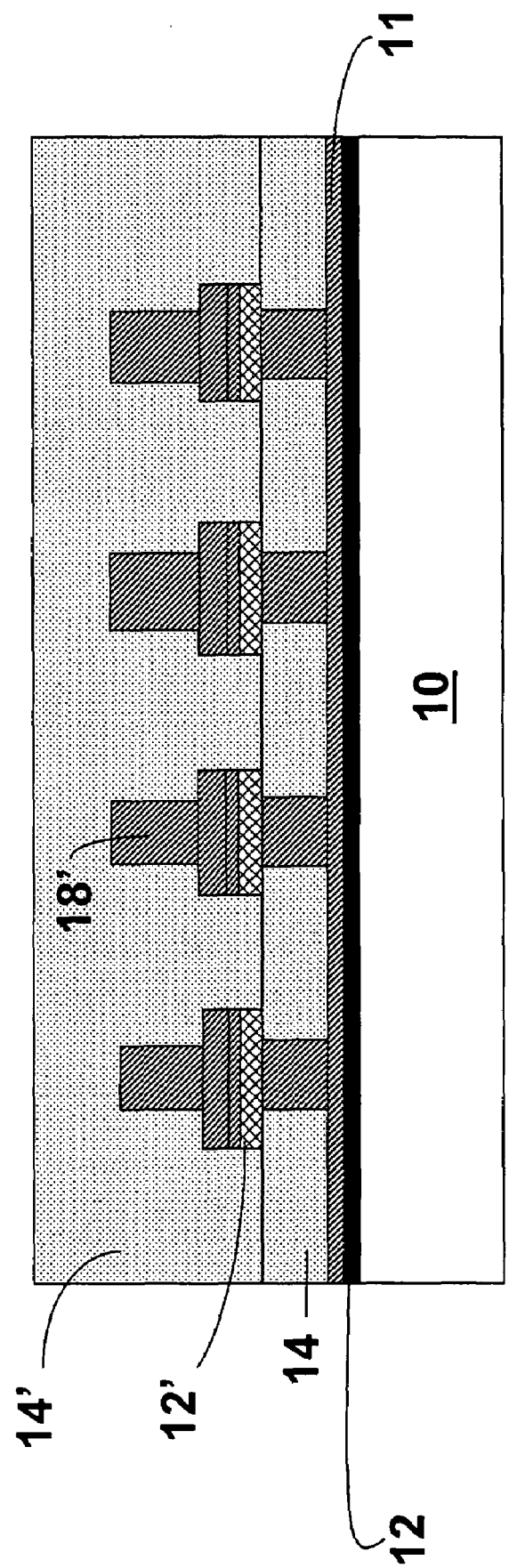
Figure 6:
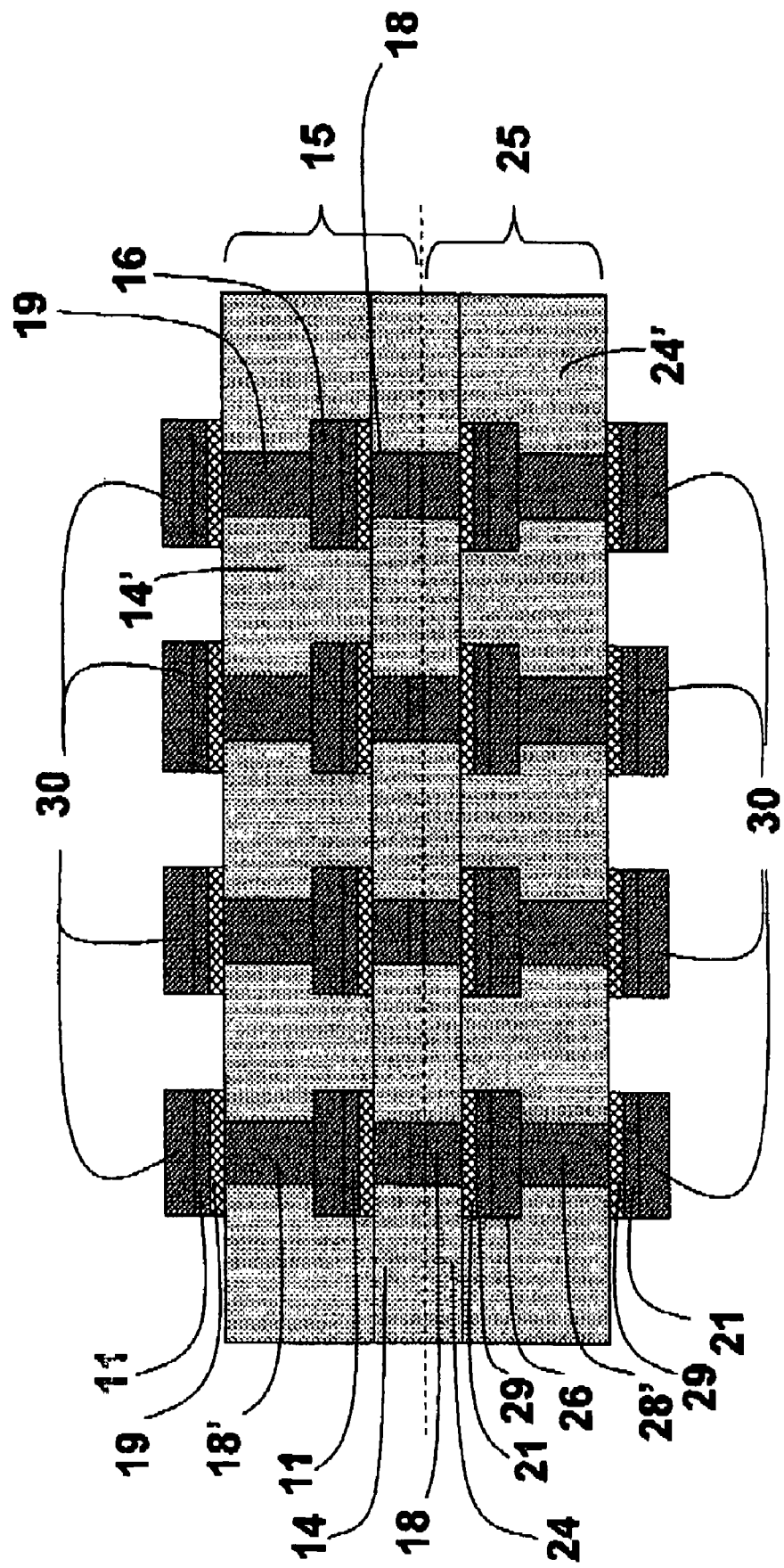
Figure 7:
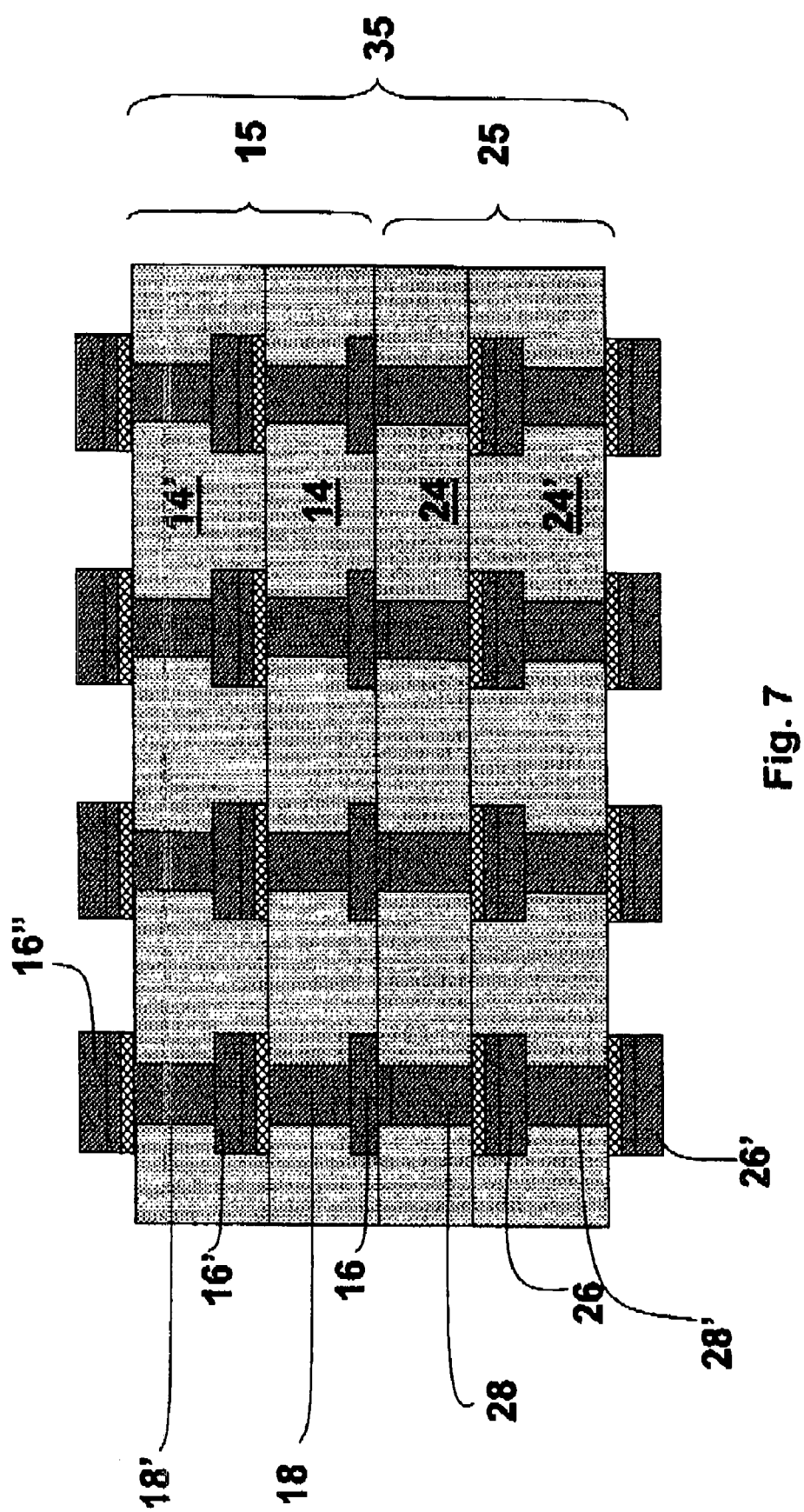
Figure 8:
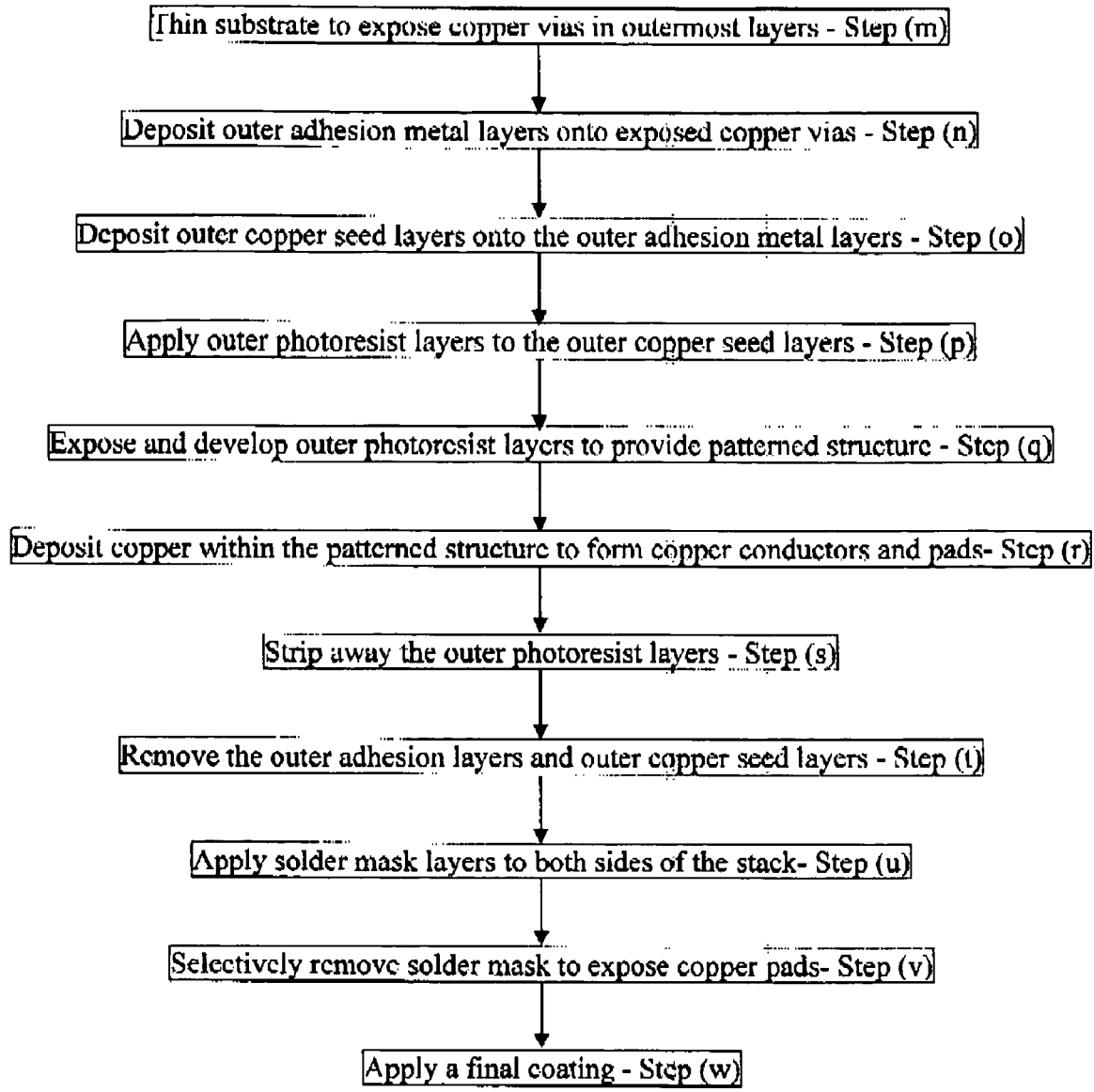
Figure 9:
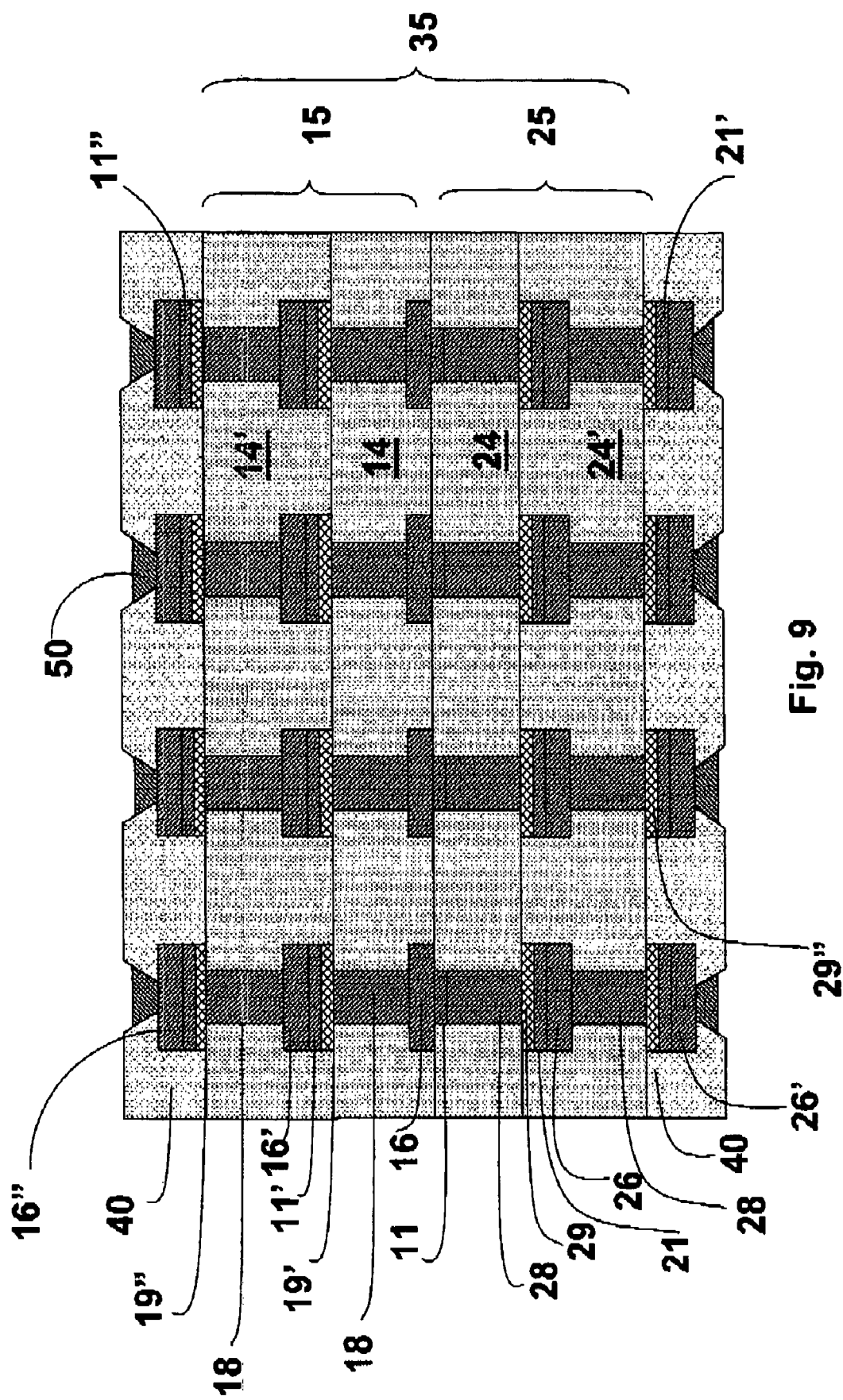
Figure 10:
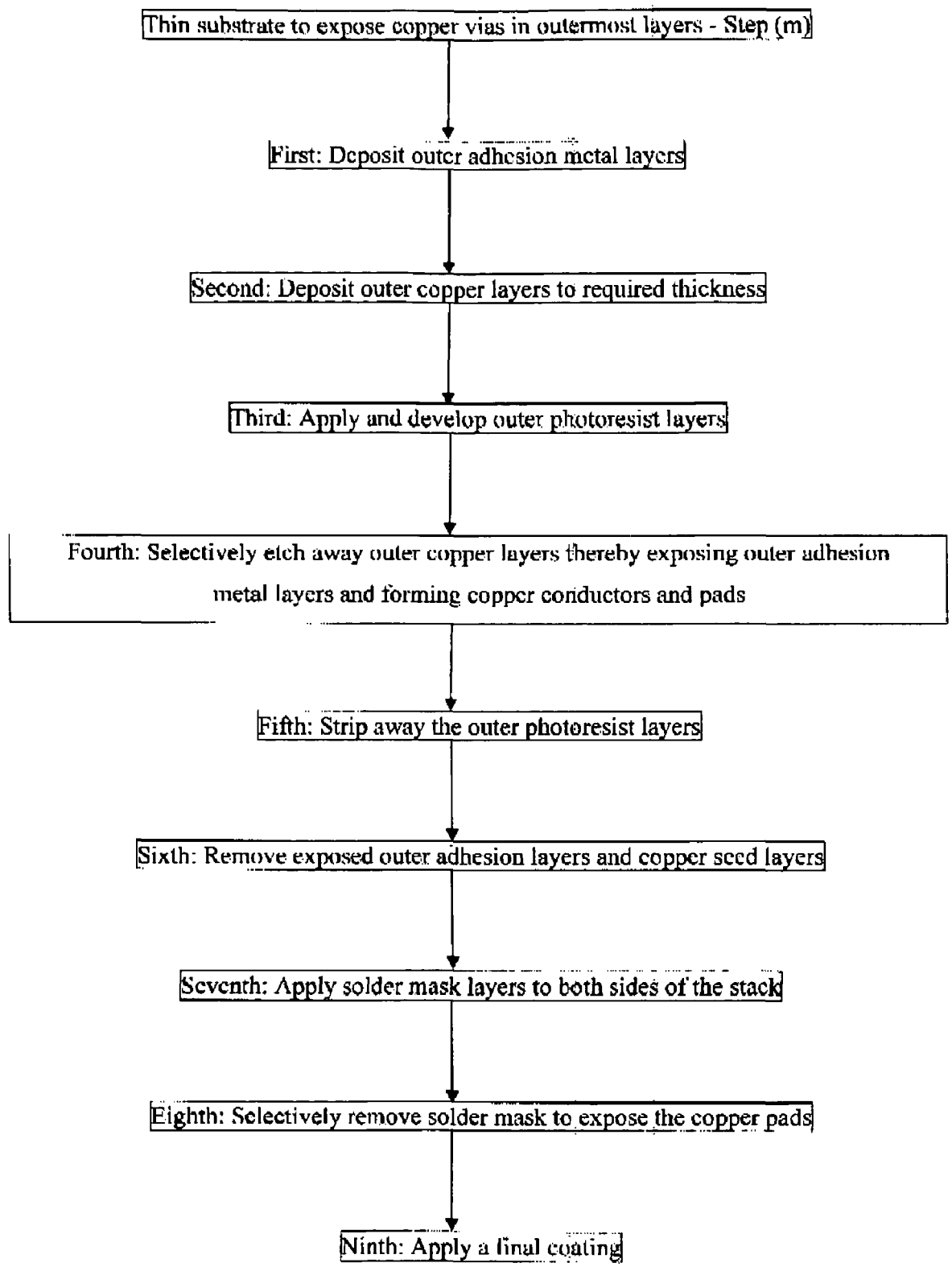

In particular, it will be noted that the cross sections of the various layers and stacks are schematic illustrations only and are not to scale, with thicknesses being greatly exaggerated. Also, the substrates and Fabrication techniques described herein are applicable to a large number of end products, and no attempt has been made to show the structure of the conductive features within each layer In the accompanying drawings:

FIG. 1 is a schematic cross section through a wire bonded IC BGA package structure of the prior art;

FIG. 2 is a schematic cross section through a Flip Chip BGA package structure of the prior art;

FIG. 3 is a schematic cross section through a typical, organic Flip Chip BGA (FCBGA) substrate type support structure of the prior art;

FIG. 4 is a flowchart showing the processing steps of the fabrication technique of the present invention;

FIGS. 4(A) to 4(L) schematically illustrate the structures produced by the steps 4(A) to 4(L) of FIG. 4;

FIG. 5 is a flowchart showing the process of building up alternate layers of conductive copper with insulative layers of polymer matrix, i.e. step (C) of FIG. 4;

FIGS. 5(i) to 5(xx) schematically illustrate the structures produced by the steps of FIG. 5;

FIG. 6 is a schematic cross section of one novel support structures that may be fabricated by the method shown in FIG. 4;

FIG. 7 is a schematic cross section of a second novel support structure that may be fabricated by adapting the method of FIG. 4;

FIG. 8 is a flowchart showing one termination route for applying terminations to the copper vias—Step (L) of FIG. 4;

FIG. 9 shows the structure of FIG. 7, terminated in accordance with FIG. 8, and FIG. 10 shows a second termination route for applying terminations to the copper vias—Step (L) of FIG. 4.

DESCRIPTION OF THE PREFERRED EMBODIMENTS

The present invention relates to a novel processing method for fabricating electronic substrates and to the novel substrates obtainable by that method. Some of the fabrication steps, such as the steps or deposition of photoresist, its exposure and subsequent removal are not described herein in any detail since the various alternative materials and processing routes are well known, and their detailing will render this description unnecessarily cumbersome. Suffice to say, when designing a specific process for a specific product, persons of the art will make appropriate selections from the various alternative materials and processing routes using well established considerations based on parameters such as batch size, substrate complexity and component resolution. Furthermore the actual architecture of the substrate is not described as a general method is provided that may be used to produce a variety of end products. What is described hereinbelow is a method for fabricating multilayer substrates of alternating conductive layers interconnected by vias through insulative layers to provide a three dimensional stacked substrate. FIG. 4 is a generalized flowchart showing the steps of a processing method For fabricating substrates of this type, and FIGS. 4(A) to 4(L) show schematically the build up of the substrate in accordance with the steps of FIG. 4.

Thus with reference to FIGS. 4, 4(A)-4(L), a first processing method for fabricating electronic substrates is shown, together with the schematic illustrations of the intermediate structures thus formed. The method comprises the steps of: selecting a first metal base layer 10—Step (A). The first base layer 10 typically has a thickness in the range between 75 μm, and 600 μm and may be fabricated from copper or a copper alloy, such as brass or bronze for example.

A First etchant resistant barrier metal layer 12 is deposited onto the first metal base layer 10—Step (B). The barrier metal 12 may be tantalum, tungsten, titanium, a titanium-tungsten alloy, nickel, tin, lead or a tin-lead alloy for example, and, in all cases may be deposited by a physical vapour deposition process such as sputtering. Where the barrier metal 12 of step (B) is nickel, tin, lead, or tin-lead alloy, it may alternatively be deposited by other techniques such as electroplating or electroless plating, for example. Typically the barrier metal 12 has a thickness in the range of 0.1 micron to 1 micron.

Next a first half stack 15 of alternating insulating layers 14 and conductive layers 16 is built up, Step (C), the conductive layers 16 being interconnected by vias 18, 18' through the insulating layers 14. The conductive layers 16 and the vias 18, 18' of the electronic substrate are typically copper, which may be deposited by electroplating or by electroless plating. Each layer is built up by applying a layer of photoresist, developing a pattern and plating a layer of copper within the pattern. Where copper is plated onto an underlying material that is not itself copper, an adhesive metal layer 12 followed by a copper seed layer 11 is first deposited. The adhesive metal layer 12 is typically between 0.1 micron and 1 micron thick, and the copper seed layer 11 typically has a thickness in the range of 0.2 μm to 5 μm. The photoresist is removed and an insulative material is layed down around the copper pattern. This step is elaborated upon with reference to FIG. 5 hereinbelow.

Next, a second base layer 20 is applied to the upper surface of the half-stack 15—Step (D). One way to achieve this is to apply an insulative layer 19 onto the second base layer 20, then to apply the second base layer 20, insulative layer 19 side first, onto the half-stack 15 and to hot press together. A protective coating of photoresist 21 is applied to the second base layer—Step (E).

Now the first base layer 10 is etched away—Step (F). Where the first base layer 10 is copper or a copper alloy, step (F) of etching away first base layer 10 may be performed using a copper etchant, such as ammonium hydroxide or copper chloride, for example.

The protective coating of photoresist is removed—Step (G).

The first barrier layer 12 is removed—Step (H), and a second stack 25 of alternating insulating layers 24 and conductive layers 26 that is substantially symmetrical to those of the first stack 15 is built up on the bottom layer of the first stack 15—Step (I) producing a full stack 35. An etch resistant insulating layer 21 is applied onto the full stack 35—Step (J) and the second base layer 20 is removed—Step (K) leaving the full stack 35, and, generally, where outer most layers are via layers, after exposing the ends of the vias by a thinning process such as grinding, CMP or etching, the vias 18 are terminated—Step (L) by adding terminations 30. The general structure so formed it shown in FIG. 4(L).

Since the lay up of the full stack 35 is largely symmetrical, the structure shows no tendency to warp.

With reference to the Flowchart of FIG. 5 and to corresponding schematic cross-sections shown in FIGS. 5(*i*) to 5(*xx*), first half stack 15 of alternating insulating layers 14 and conductive layers 16 (step (C) of FIG. 4) is built up by (i) depositing a copper seed layer 11 onto barrier layer 12. Copper seed layer 11 typically has a thickness in the range of 0.2 μm to 5 μm.

Where a first insulative layer with vias therethrough is desired, a photoresist layer 13 having a thickness in the range of 25 microns to 120 microns is deposited onto the copper seed layer 11 Step 5(ii). The photoresist layer 13 is exposed and developed to form a pattern of features—Step 5(iii), which may have planar dimensions of from around 25 microns to single millimeter, i.e. thousands of microns. Next, copper 18 is pattern electroplated—Step 5(iv) onto the features to form solid copper vias 18 The photoresist layer 13 is stripped away Step 5(v), leaving the bare copper vias 18 which are then coated by a first polymeric insulating material layer 14—Step (vi), which is thinned down to expose the ends of the copper vias—Step (vii).

The insulative layer 14 may comprise a thermoplastic matrix material such as Teflon and derivatives thereof or a thermosetting polymeric resin such as bismaleimide triazine, epoxy resins, polyimide resins, mixtures thereof, or a resin having mixed thermoplastic; and thermosetting properties. Preferably the polymeric resin of the insulative layer 14 includes inorganic particulate fillers, usually of a ceramic or glass, having particle sizes of the order of single microns, specifically, between 0.5 microns and 5 microns; the polymeric matrix containing 15% to 30% of particulate filler by weight.

In preferred embodiments, the insulative layers 14 are fiber matrix composite materials including organic fibers such as glass fibers or polyamide fibers (Kevlar). Such fibers may be chopped fibers or continuous fibers arranged in cross-plied arrangements or as woven mats. These are available, pre-impregnated with partially cured polymeric resins as prepregs.

In most preferred embodiments, two woven fiber prepregs of fibers—matrix composite materials having ceramic fillers in the polymer matrix are used. Suitable candidate epoxy and polyimide matrix woven prepregs are available from Arlon Inc. Rancho Cucamonga, Calif., USA. These prepregs are applied over the copper substructure or vias, and then the structure is consolidated by hot press lamination. The fibers running though the insulating layers provide additional strength and stiffness, allowing the overall structure to be thinner, and further facilitate the attainment of planarity.

The thinning process—Step (vii) may include dry etching, mechanical grinding, chemical mechanical polishing (CMP) or combinations thereof Typically dry etching will be followed by chemical mechanical polishing.

To remove polymer smear from the surface of copper vias exposed by the thinning process, a post-thinning cleaning process appropriate to the polymeric material selected for the insulative layer is applied. For example, where the polymeric material is an epoxy or a polyimide, the post thinning cleaning process might include application of a potassium permanganate solution, typically at a concentration of 55 to 75 grams per liter of $KMnO_3$ at a temperature of 70° C. to 95° C. Additionally or alternatively, a plasma dry etch process may be applied. One suitable plasma dry etch uses a mixture of $CF_4$ and oxygen; the mixture typically having a ratio of $CF_4$ to Oxygen of between 1:1 and 3:1.

Next, an adhesion metal layer 12'—Step 5(viii) is deposited onto the thinned polymeric material. The adhesion metal layer 12' may be fabricated from titanium, chrome or nickel-chrome, for example, and will typically have a thickness in the range of 0.04 microns to 0.1 microns. When exposed on the surface, by the thinning and cleaning processes described hereinabove, the particles of the filler within the polymeric matrix (of the insulative layer 14, provide a microroughness that aids adhesion of the adhesion metal layer 12' to the insulative layer 14.

A second copper seed layer 11' is flow deposited Step (ix). The adhesion metal layer 12' serves to bond the copper seed layer 11' to the insulative layer 14 to prevent delamination.

A second photoresist layer 13' is applied onto the second copper seed layer 11'—Step (x). The second photoresist layer 13' is exposed and developed to form a pattern of features—Step (xi), and copper is pattern electroplated inside the pattern of features Step (xii) to form a first copper feature layer 16.

Essentially steps (x) to (xii) are similar to steps (ii) to (iv) but in this case, the thickness of the conductive layer 16 may he as little as 10 microns, depending, inter alia, on the dimensions of the features within the conductive layer 16, which may themselves be only 10 microns or so, in consequence of the high planarity achievable by this processing technique.

The second photoresist layer 13' is now removed (Step xiii) and a third, thicker photoresist layer 13" is deposited in its place—Step (xiv), typically having a thickness in the range of 25 microns to 120 microns. This third photoresist layer 13" is then exposed and developed to form a second via pattern—

Step (xv). Copper is now deposited into the second via pattern to form a second copper via layer—Step (xvi).

The third photoresist layer is now stripped away—Step (xvii), exposing the copper features, second copper vias and second copper seed layer. The second copper seed layer thus exposed is now removed—Step (xviii). This may be accomplished by wet etching with a dilute aqueous solution of 5% by weight of ammonium sulphate $(NH_4)_2S_2O_8$, at 50° C. to 55° C. for example.

The adhesive layer that is thus exposed is also removed—Step (xix) by an etching technique that is a function of the specific metal used for the adhesive layer. For example, where a titanium adhesion layer is used, it may be removed by plasma etching using a mixture of $CF_4$ and argon, typically having a $CF_4$: argon ratio of between 1:1 and 3:1 followed by a 5% aqueous hydrofluoric acid (HF) solution at room temperature.

Now an insulative layer 14' is applied over the exposed features and vias 18—Step (xx). The insulative layer 14' may comprise a thermoplastic matrix material such as Teflon and derivatives thereof, or a thermosetting polymeric resin such as bismaleimide triazine, epoxy resins, polyimide resins, mixtures thereof, or a resin having mixed thermoplastic and thermosetting properties. Preferably the polymeric resin of the insulative layer 28 includes inorganic particulate fillers, usually of a ceramic or glass, having particle sizes of the order of single microns, specifically, between 0.5 microns and 5 microns; the polymeric matrix containing 15% to 30% of particulate filler by weight.

In preferred embodiments, the insulative layer 14' is a fiber matrix composite material including organic fibers such as polyamide fibers (Kevlar) or glass fiber, for example. Such fibers may be chopped fibers or continuous fibers arranged in cross-plied arrangements or as woven mats. These are available, pre-impregnated with partially cured polymeric resins as prepregs.

In most preferred embodiments, two woven fiber prepregs of fibers—matrix composite materials having ceramic fillers in the polymer matrix are used. Suitable candidate epoxy or polyimide matrix woven prepregs are available from Arlon Inc. Rancho Cucamonga, Calif., USA. These prepregs are applied onto the copper substructure of vias 18', and are cured by a hot press lamination process. The fibers running though the insulating layers provide additional strength and stiffness, allowing the overall structure to be thinner, and further facilitate the attainment of planarity.

Where it is desirable to deposit further layers of features and vias, the insulative layer 14' is thinned down by a thinning process to expose the solid copper features of the copper substructure 18' and further alternating conductive layers and insulating layers, having conductive vias therethrough, are built up by repeating steps 5(vii) to 5(xx) to form additional conductive and insulating layers of first layered stack 15. In each case, after removing the photoresist from around the plated copper features, the copper seed layer and adhesive metal layer are removed to prevent shorting.

Referring back to FIG. 4—Step (I), the second half stack 25 is built up in a similar manner, and will typically have a mirror lay up to the first half stack 15, but may differ slightly with the first half stack 15 starting with a conductive layer 16, and the second hall stack 25 starting with a via 28 in insulative layer 24, for example. Once barrier layer 12 is removed, copper seed layer 11 is exposed and the first layer of second half stack 25 may be deposited straight onto copper seed layer 11.

Thus where the second half stack 25 starts with a via 28 in insulative 24 layer, that is, by continuing the vias 18 of the first stack, step (I) comprises the following sub-steps; (Iii) applying a layer of photoresist onto copper seed layer 11 deposited in sub-step (i) of (C), (Iiii) exposing and developing the layer of photoresist to form a pattern of vias that are aligned with the vias 18 of the first half, stack 15; (Iiv) pattern electroplating copper inside the pattern of vias to provide vias 28 that continue the first layer of copper vias. 18 of the first half stack 25, (Iv) stripping away the first layer of photoresist; (Ivi) applying a first layer of polymeric insulating material 24, and (Ivii) thinning down the layer of polymeric insulating material 24 to expose the first layer of copper vias 28.

As will be clear to those experienced in the art, it is desirable to achieve a substantially planarized and leveled surface after thinning the outermost insulative layers 14 and exposing the solid copper via 18 features therein. This increases the manufacturing yields of the various photolithography processes used to define the feature size of the following on copper conductor layers. Where substantially planar surfaces having a surface roughness of better than 1 micron are produced, it is possible to obtain resolution of conductor lines and spaces in the subsequent layer of copper features that are as fine as 20 microns.

Furthermore, it will be appreciated that the rationale behind building up the laminate stack of the invention onto base layers of a relatively thick layer of at least 75 microns of copper, is that it provides better registration accuracy than that obtained by layered structures deposited onto traditional substrate cores, and thereby enables very high density patterning Steps in the copper conductor and via layers that follow. A too thick copper base layer makes its removal by etching unnecessarily time consuming, and for embodiments as described herein, a thickness of between 75 microns and 600 microns has been found to be appropriate for first and second base layers 10, 20.

Figure 4D:
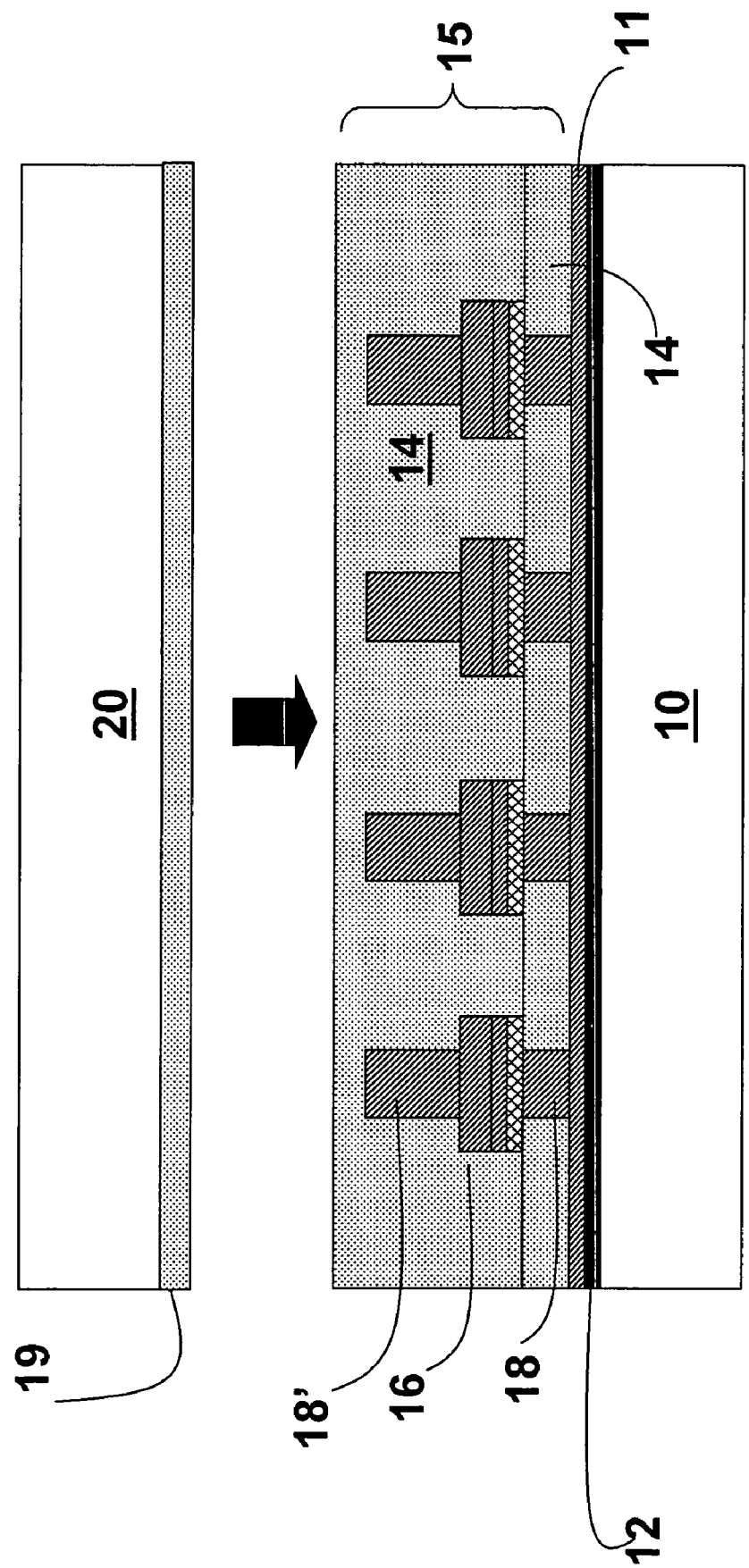
Figure 4E:
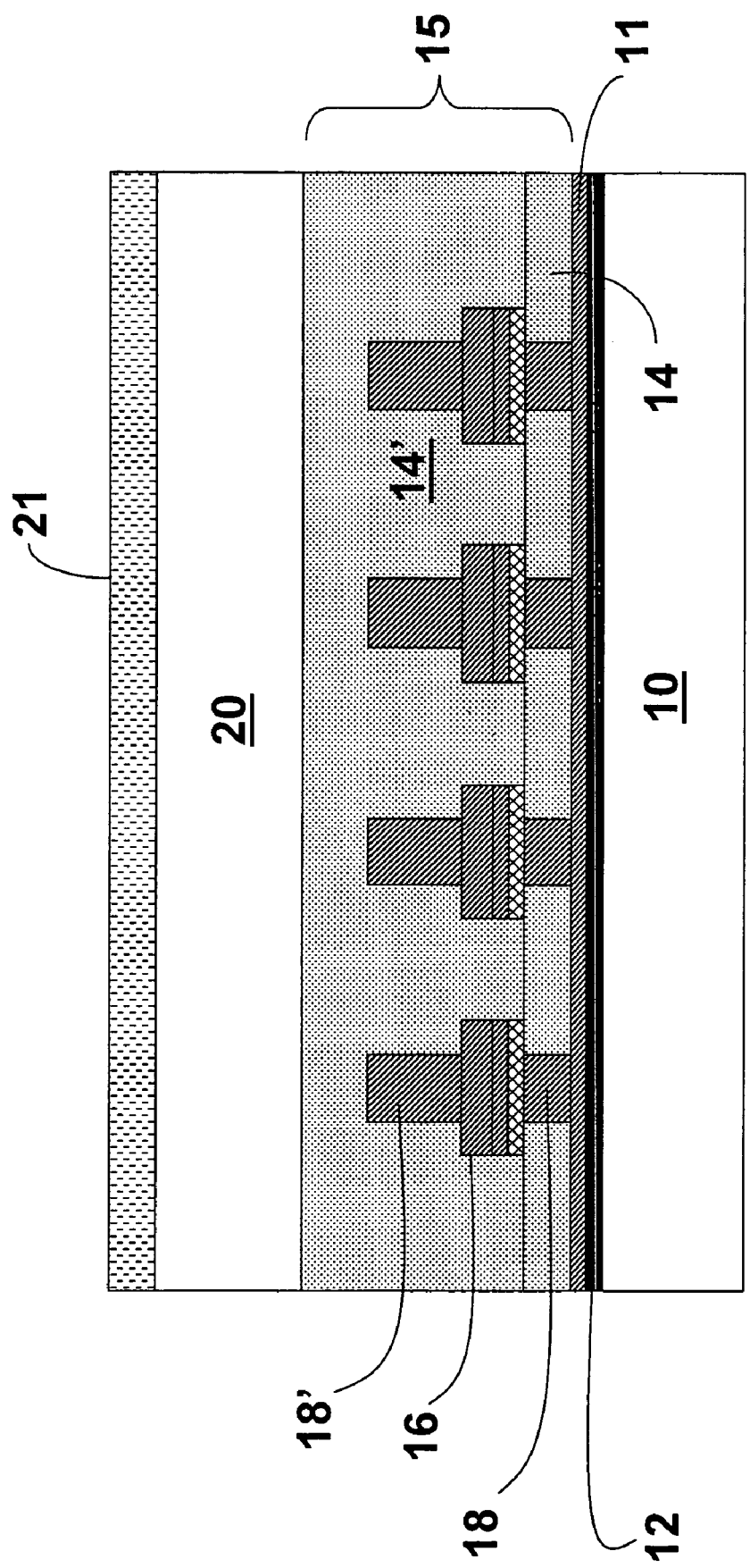
Figure 4F:
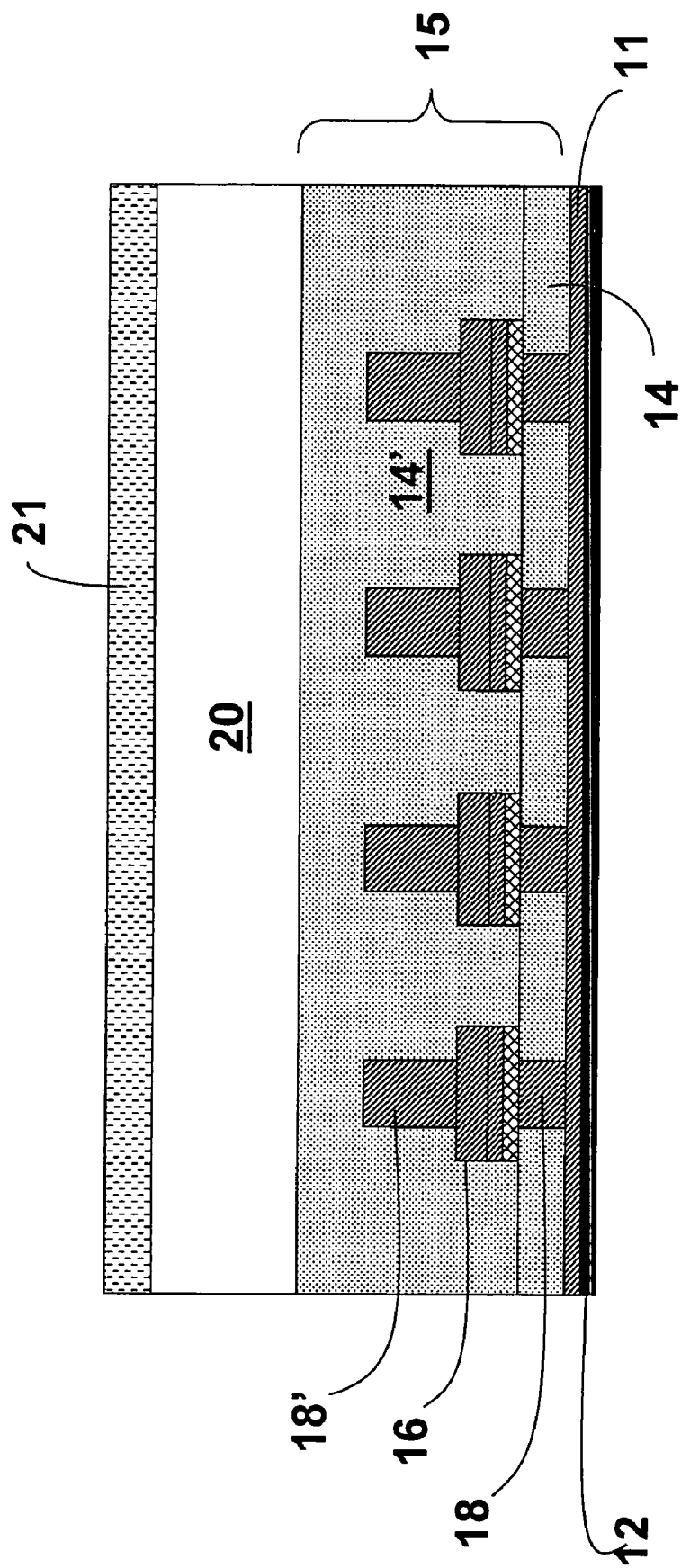
Figure 4G:
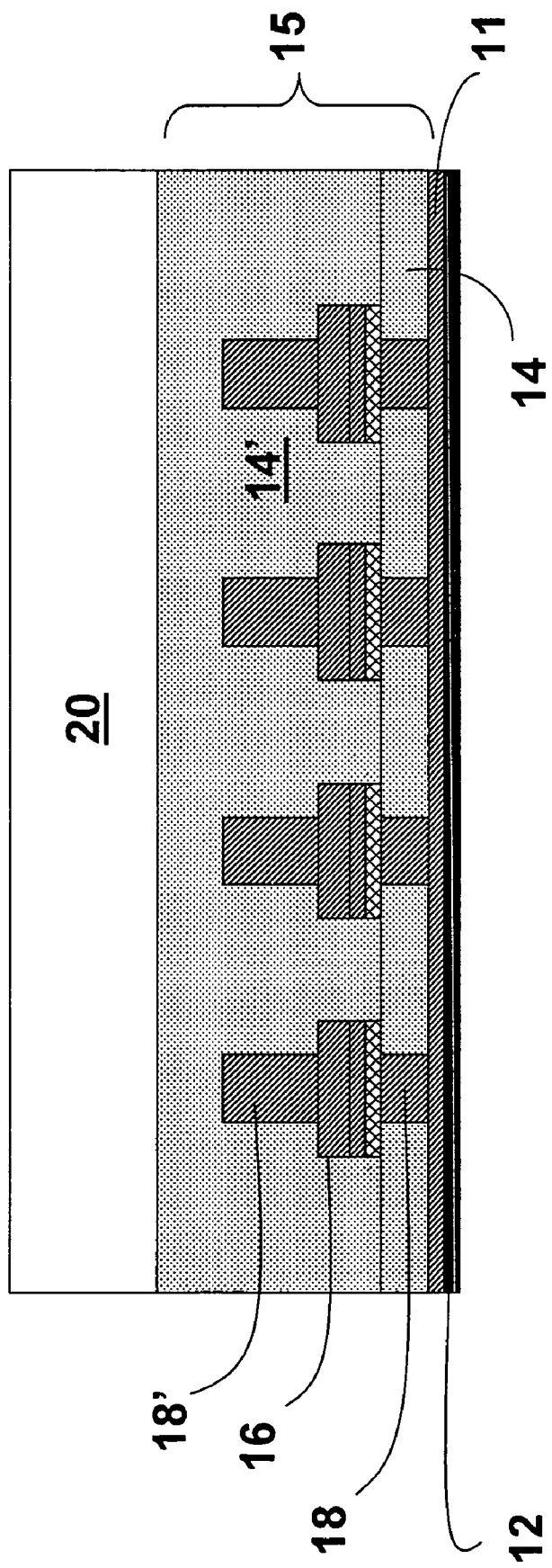
Figure 4H:
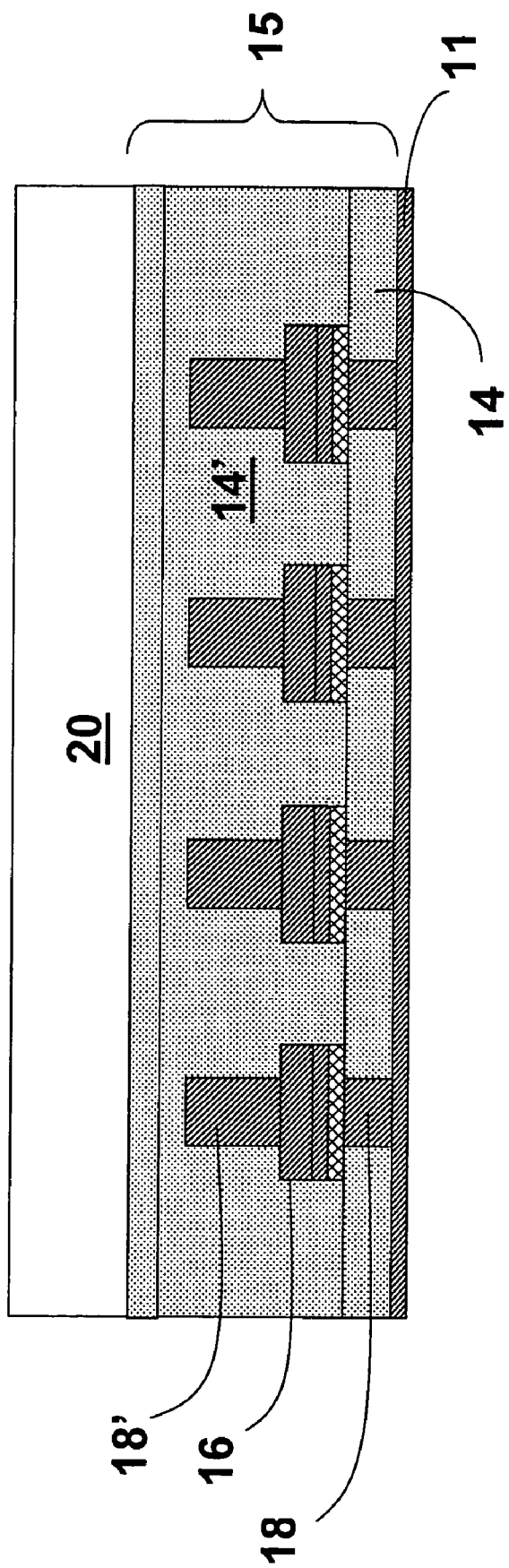
Figure 4I:
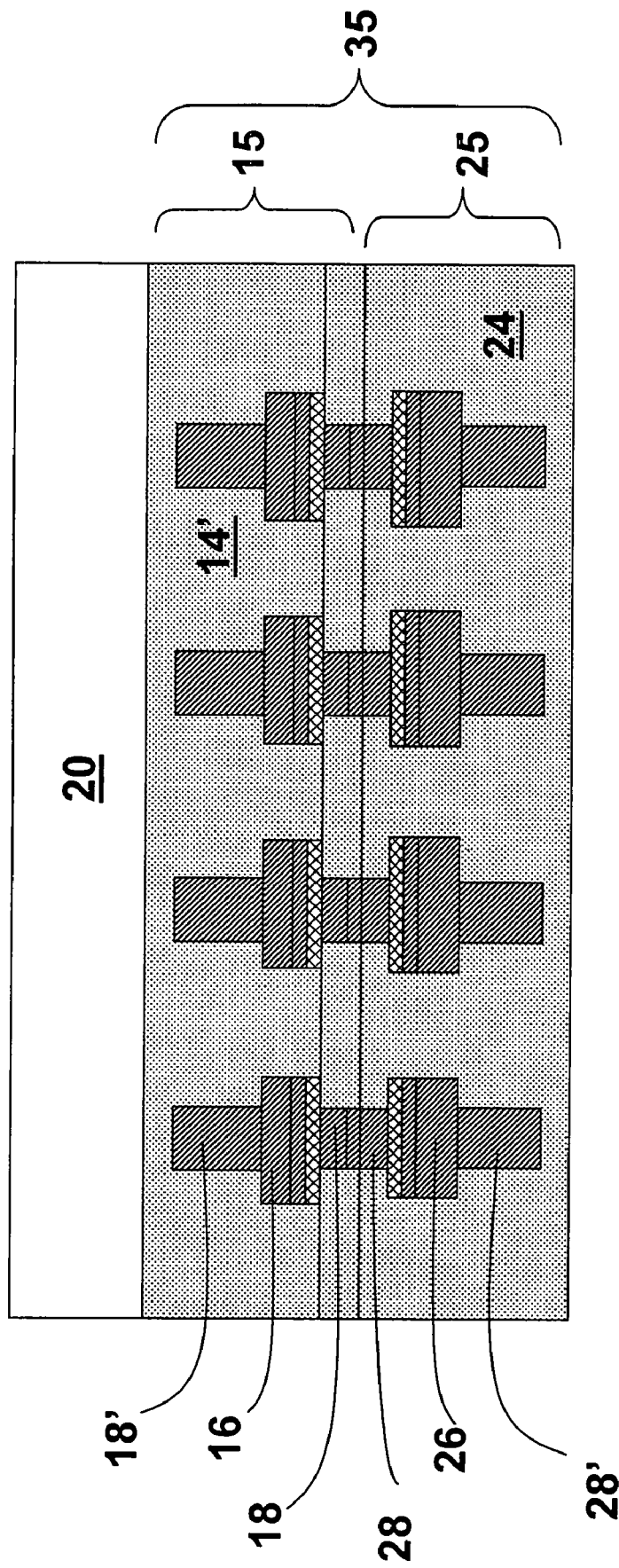
Figure 4J:
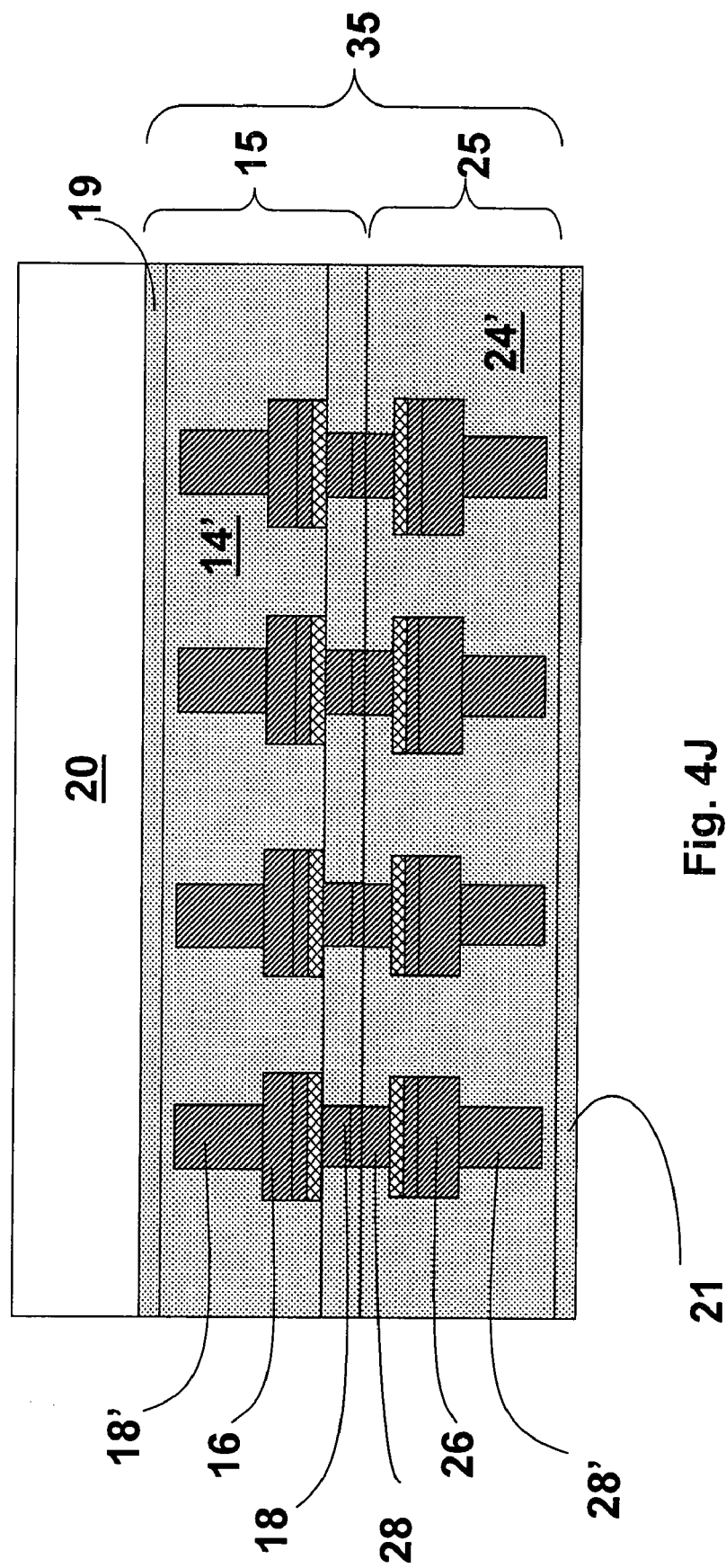
Figure 4K:
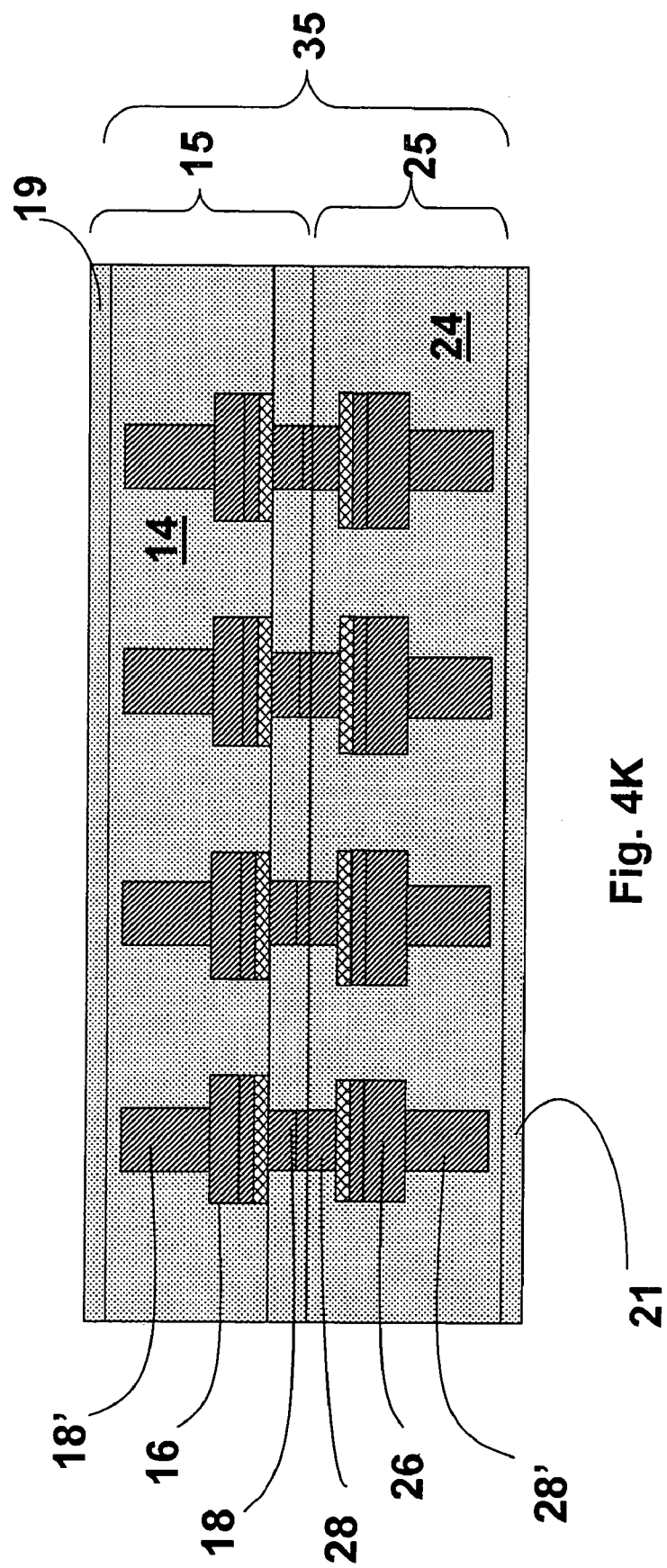
Figure 4L:
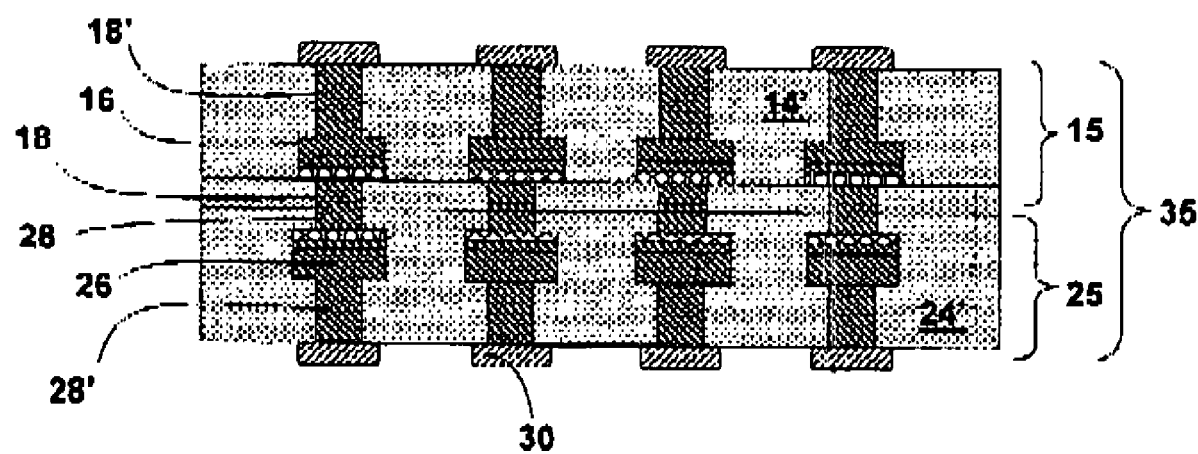

Referring back to FIG. 4, and with further reference to FIG. 4(D), once the first half stack is formed, a second base layer 20 having a thickness in the range of 75 μm to 600 μm is applied (step (D)). One application technique involves applying a polymer layer 19 onto the second metal base layer 20, and then hot press laminating the applied polymer layer 19 to adhere it to the first half-stack 15. The application of the polymer layer 19 onto the second metal base layer 20 may be performed by laying down a polymer prepreg. A photoresist layer 21 is applied thereupon to protect the second base layer 20 Step (E).

Step (F) of etching away first base layer 10 uses a wet etch process, with the barrier layer 12 fabricated in step (B) acting as an etch stop. Obviously the appropriate etchant will depend on the barrier layer chosen. For example, where the barrier layer 12 is tantalum, the wet etch process for step (F) of etching away the base layer 10 might be exposing to a solution of ammonium hydroxide at an elevated temperature. The tantalum barrier layer 12 may then be removed by plasma etching using a mixture of $CF_4$ and Ar, typically having a $CF_4$ to argon ratio of between 1:1 and 3:1; other barrier metals being removable by other known techniques.

Now, depending on the desired structure, different first layers of the second half stack may be deposited.

As shown in FIG. 6, for example, the first layer 24 of the second half stack 25 may be the mirror image of the bottom layer 14 of tie first half stack 15, so that second portions of vias 28 are deposited onto first portions 18, to give whole vias. Although this requires accurate positioning, such positioning is within the state of the art.

The process of building up the second half stack 25 (Step (I) of FIG. 4) is substantially similar to that used to build up the first half stack 15 (Step (C) of FIG. 4), mutatis mutandis. Thus, where the second half stack 25 starts with a via layer 28, that is, by continuing the vias 18 of the first half stack 15, step (I) comprises the following sub-steps:

(Iii) applying a layer of photoresist onto copper seed layer deposited in sub-step (i) of (C);

(Iiii) exposing and developing the layer of photoresist to form a pattern of vias;

(Iiv) pattern electroplating copper inside the pattern of vias to form a first layer of copper Vias;

(Iv) stripping away the first layer of photoresist;

(Ivi) applying a first layer of polymeric insulating material;

(Ivii) thinning down the layer of polymeric insulating material to expose first layer of copper vias;

(Iviii) depositing a first layer of adhesion metal;

(Iix) depositing a second seed layer of copper;

(Ix) applying a second layer of photoresist onto the second seed layer of copper;

(Ixi) exposing and developing the second layer of photoresist to form a pattern of features;

(Ixii) pattern electroplating copper inside the pattern of features in second layer of photoresist to form a first layer of copper features;

(Ixiii) Stripping away the second layer of photoresist;

(Ixiv) applying a third layer of photoresist;

(Ixv) exposing and developing the third photoresist layer to form a second pattern of vias;

(Ixvi) depositing copper into second pattern of vias to form a second layer of copper vias;

(Ixvii) stripping away second and third layers of photoresist and exposing the copper features, second layer of copper vias and second seed layer of copper;

(Ixvii) removing the second seed layer of copper thus exposed;

(Ixix) removing the first layer of adhesion metal, and (Ixx) applying a second layer of polymeric insulative material over the copper features and copper vias thus exposed.

The resultant full stack 35 has an odd number of insulative via layers and an even number of conductive layers. As illustrated in FIG. 6, three insulating layers 14', 14/24, 24' with vias 18', 18/28, 28' therethrough and two inner conductive layers 16, 26 may be formed, with outer termination layers 30 thereupon.

As shown in FIG. 7 in an alternative embodiment, the first layer of the first half stack 15 may be a feature layer 16. In this manner, an odd number of conductive layers (16, 16', 16", 26, 26') and an even number of insulative via layers (18, 18', 28, 28') are formed.

Such a structure may be built up by: (x) applying a layer of photoresist to the seed layer deposited in sub-step (i) of (C); (xi) exposing and developing the layer of photoresist to form a pattern of features, (xii) pattern electroplating copper inside the pattern of features in the layer of photoresist to form a first layer of solid copper Features; (xiii) stripping away the first layer of photoresist, (xiv) applying a second layer of photoresist; (xv) exposing and developing the second layer of photoresist to form a pattern of vias; (xvi) depositing copper into the pattern of vias to form a layer of copper vias; (xvii) stripping away the second layer of photoresist and exposing the copper features, copper vias and copper seed layer; (xviii) removing the copper seed layer thus exposed; (xix) removing the adhesive metal layer thus exposed; (xx) applying a layer of polymeric insulative material over the copper features and vias thus exposed.

The second half stack may he built up further by depositing additional layers of features and vias in the sample manner as the first half stack, mutatis mutandis, by:

(Iviii) depositing a layer of adhesion metal, (Iix) depositing a second seed layer of copper thereon; (Ix) applying a second layer of photoresist onto the second seed layer of copper; (Ixi) exposing and developing the second layer of photoresist to firm a pattern of features; (Ixii) pattern electroplating copper inside the pattern of features in second layer of photoresist to form a first layer of copper features; (Ixiii) removing second layer of photoresist; (Ixiv) applying a third layer of photoresist; (Ixv) exposing and developing the third photoresist layer to form a second pattern of vias; (Ixvi) depositing copper into second pattern of vias to form a second layer of copper vias; (Ixvii) stripping away third layer of photoresist and exposing the copper features, second layer or copper vias aid second seed layer of copper; (Ixviii) removing the second seed layer of copper thus exposed; (Ixix) removing the first layer of adhesion metal, and (Ixx) applying a second layer of polymeric insulative material over the copper features and copper vias thus exposed.

In both embodiments, steps (C) and (I) may include deposition of further layers of features and vias by repeating steps (vii) to (xx) and (Ivii) to (Ixx) respectively, one or more times to build more complex multilayer stacks.

Thus although three and four insulative layer stacks are shown in FIGS. 6 and 7 respectively, it will be appreciated that the method of fabricating multilayer structures wherein a first half stack is built up on a substrate that is then removed and a second half stack is built up on the exposed bottom surface of the lower layer of the first stack is inherently flexible. As long as there are equal numbers of insulative polymeric layers in both half stacks, the shrinkage stresses introduced on curing the different layers cancel each other out and high planarity is achieved and the method described hereinabove and illustrated in FIG. 5 may be modified somewhat, depending on the desired lay up.

It will be further appreciated that the novel substrate structures fabricated in this manner need not be fully symmetrical but only substantially symmetrical. The first and second half stacks may differ slightly, without risk of warping.

Once the whole stack is formed, there are various materials and processing routes for the termination stage. With reference to FIGS. 8 and 9, one such termination route involves applying conductor layers 16', 26" to outer surfaces (top and bottom) of the stacked structure by: (m) thinning the substrate on both sides by mechanically grinding, by chemical mechanical polishing (CMP) or by dry etching, (n) depositing outer adhesion metal surface layers 19', 29" to outer layers of stacked structure; (o) depositing outer copper seed layers 11', 21" onto the outer adhesion metal surface layers; (p) applying photoresist layers to the outermost copper seed layers 11'21"; (q) exposing and developing the photoresist layers to provide a patterned structure; (r) depositing copper conductors and pads within this patterned structure 16', 26"; (s) removing these outer photoresist layers to leave the copper structure; (t) removing the outer adhesion layers 19', 29" and copper seed layers 11', 21"s; (u) applying solder mask layers 40; (v) selectively removing the solder mask layers 40 to expose the copper pads 16', 26" and (w) allow termination of exposed copper pads 16', 26" with a protective coating 50 selected from the list of nickel, gold, tin, lead, silver, palladium and alloys and amalgams thereof, or with a tarnish resistant organic material. The resulting structure is shown in FIG. 9.

FIG. 9 shows the structure of FIG. 7, mutatis mutandis, with solder mask layers 40 covering the outer insulative layers of polymeric matrix with particle filler 14', 24', and having the copper contacts 16', 26" terminated with wire bondable and/or soldable terminations 50 for IC and/or passive component assembly.

Other termination routes are possible. Thus with reference to FIG. 10, a so-called "print and etch" method may he used for applying termination layers to the outer surfaces of the stacked structure. After thinning the substrate to expose copper vias in the outermost layers of the structure shown in FIG. 7, the "print and etch" method consists of first depositing adhesion metal layers over the exposed vias, then panel electroplating or otherwise depositing copper layers on each side to the required thickness, next further photoresist layers are applied and developed, and then the copper thus exposed is selectively etched away, leaving copper conductors and pads under the photoresist layer which is then stripped away The outer adhesion layers and copper seed layers are now removed, and, as with the method of FIG. 8, solder mask layers are applied to both sides of the stack, and then selectively removed to expose the copper pads, and finally, a final coating, such as nickel, gold, tin, lead, silver, palladium and alloys or amalgams thereof or one of the available organic anti-tarnish finishes, is applied.

It will be noted that due to the problems of covering and protecting the tall copper vias (pillars) while the conductor layers are being etched, tile "print and etch" method is impractical for fabricating the inner structure of the substrate and is only really applicable for applying termination layers.

It will be appreciated that the termination processing routes described hereinabove is by way of enabling example only. Other termination processes and structures of the prior art may be substituted without exceeding the scope of the present invention.

By fabricating free standing multilayer substrates having symmetrical lay ups of polymeric insulating layers, the residual stresses resulting from shrinkage of the polymer are alleviated, and a high flatness results, allowing the multilayer substrate of the present invention to be used as an intermediary between ICs and printed circuit boards, providing good contact with both.

As described hereinabove, the multilayer substrate consists of alternating conductive layers having high conductivity and serving as conductive paths and insulating layers that serve as insulators. It will be appreciated however, that conductive layers may include resistors, in-layer capacitors, inductors and the like. Generally the polymeric insulating layer is selected to provide high resistance to breakthrough voltage. In some embodiments, the dielectric constant of the insulating layer and its physical dimensions will be selected to provide desired capacitive effects.

Thus persons skilled in the art will appreciate that the present invention is not limited to what has been particularly shown and described hereinabove. Rather the scope or the present invention is defined by the appended claims and includes both combinations and sub combinations of the various features described hereinabove as well as variations and modifications thereof, which would occur to persons skilled in the art upon reading the foregoing description.

In the claims, the word "comprise", and variations thereof such as "comprises", "comprising" and the like indicate that the components listed are included, but not generally to the exclusion of other components.

The invention claimed is:

1. A method of fabricating an electronic substrate comprising the steps of fabricating a full stack by:
    (A) selecting a first base layer;
    (B) depositing a first etchant resistant barrier layer comprising tantalum or nickel onto said first base layer;
    (C) building up a first half stack of alternating conductive layers and insulating layers, the conductive layers being interconnected by vias through the insulating layers;
    (D) applying a second base layer onto said first half stack;
    (E) applying a protective coating of photoresist to said second base layer;
    (F) etching away said first base layer by exposing said first base layer to a solution of ammonium hydroxide at an elevated temperature;
    (G) removing the protective coating of photoresist;
    (H) removing said first etchant resistant barrier layer;
    (I) building up a second half stack of alternating conductive layers and insulating layers, the conductive layers being interconnected by vias through the insulating layers, wherein second half stack has a substantially symmetrical lay up to first half stack;
    (J) applying an insulating layer onto said second half stack of alternating conductive layers and insulating layers, and
    (K) removing said second base layer.

2. The method of claim 1 further comprising a step (L) of terminating the full stack by exposing ends of vias on outer surfaces and applying terminations to said ends of vias.

3. The method of claim 1, wherein the second base layer comprises a metal, and step (D) of applying a second base layer comprises applying an insulating polymeric layer onto a side of the second base layer, contacting the side of the second base layer with applied insulating polymeric layer thereon, to the first stack and hot press laminating the base layer to the first stack.

4. The method of claim 1, wherein the first base layer is fabricated from copper or a copper alloy, and step (F) of etching away first base layer is performed using a copper etchant.

5. The method of claim 1, wherein the barrier layer of step (B) is deposited to a thickness of at least 0.1 micron.

6. The method of claim 1, wherein the barrier layer of step (B) is deposited to a thickness of not more than 1 micron.

7. The method of claim 1, wherein conductive layers and interconnecting vias built up in steps (C) and (I) comprise copper deposited using techniques selected from the group consisting of electroplating and electroless plating.

8. The method of claim 1, wherein step (F) of etching away first base layer uses a wet etch process, and the barrier layer fabricated in step (B), acts as an etch stop.

9. The method of claim 1, wherein step (H) of removing the first barrier layer comprises plasma etching using a mixture of $CF_4$ and Argon having a $CF_4$ to Argon ratio of between 1:1 and 3:1.

10. The method of claim 1, wherein Step (C) comprises the sub-steps of:
    (I) depositing a copper seed layer;
    (ii) applying a first photoresist layer onto said copper seed layer;
    (iii) exposing and developing said first photoresist layer to form a pattern;
    (iv) pattern electroplating copper inside the pattern to form a first copper via layer;
    (v) stripping away the first photoresist layer;
    (vi) applying a first polymeric insulating material layer;
    (vii) thinning down the polymeric insulating material layer to expose first copper via layer;
    (viii) depositing a first adhesion metal layer;
    (ix) depositing a second copper seed layer;
    (x) applying a second photoresist layer onto said second copper seed layer;
    (xi) exposing and developing said second photoresist layer to form a pattern of features;

(xii) pattern electroplating copper inside the pattern of features in second photoresist layer to form a first copper feature layer;
(xiii) stripping away said second photoresist layer;
(xiv) applying a third photoresist layer;
(xv) exposing and developing said third photoresist layer to form a second via pattern;
(xvi) depositing copper into second via pattern to form a second copper via layer;
(xvii) stripping away third photoresist layer and exposing said copper features, second copper vias and second copper seed layer;
(xviii) removing said second copper seed layer thus exposed;
(xix) removing said first adhesion metal layer, and
(xx) applying a second polymeric insulative material layer over the copper features and vias thus exposed.

11. The method of claim 10, wherein Step (I) comprises the sub-steps of:
(Iii) applying a layer of photoresist onto copper seed layer deposited in sub-step (i) of (C);
(Iiii) exposing and developing said layer of photoresist to form a pattern of vias;
(Iiv) pattern electroplating copper inside the pattern of vias to form a first layer of copper vias;
(Iv) stripping away the first layer of photoresist;
(Ivi) applying a first layer of polymeric insulating material;
(Ivii) thinning down the layer of polymeric insulating material to expose first layer of copper vias;
(Iviii) depositing a first layer of adhesion metal;
(Iix) depositing a second seed layer of copper;
(Ix) applying a second layer of photoresist onto said second seed layer of copper;
(Ixi) exposing and developing said second layer of photoresist to form a pattern of features;
(Ixii) pattern electroplating copper inside the pattern of features in second layer of photoresist to form a first layer of copper features;
(Ixiii) stripping away the second layer of photoresist;
(Ixiv) applying a third layer of photoresist;
(Ixv) exposing and developing said third photoresist layer to form a second pattern of vias;
(Ixvi) depositing copper into second pattern of vias to form a second layer of copper vias;
(Ixvii) stripping away the third layer of photoresist and exposing said copper features, second layer of copper vias and second seed layer of copper;
(Ixviii) removing said second seed layer of copper thus exposed;
(Ixix) removing said first layer of adhesion metal, and
(Ixx) applying a second layer of polymeric insulative material over the copper features and copper vias thus exposed.

12. The method of claim 1 wherein Step (C) is built up from a conductive layer and comprises the sub-steps of:
(i) depositing a copper seed layer;
(ii) applying a first photoresist layer onto said copper seed layer;
(iii) exposing and developing said first photoresist layer to form a pattern;
(xii) pattern electroplating copper inside the pattern of features in first photoresist layer to form a first copper feature layer;
(xiii) stripping away first photoresist layer;
(xiv) depositing a second photoresist layer;
(xv) exposing and developing said second photoresist layer to form a via pattern;
(xvi) depositing copper into via pattern to form a copper via layer;
(xvii) stripping away second photoresist layer and exposing copper features, second copper vias and second copper seed layer;
(xviii) removing said second copper seed layer thus exposed;
(xix) removing said first adhesion metal layer, and
(xx) applying a polymeric insulative material layer over the copper features and vias thus exposed.

13. The method of claim 10, wherein first half stack and said second half stack comprise further layers built up by step (C) further comprising sub-step (xxi) of repeating sub-steps (vii) to (xx) one or more times, and step (I) further comprising sub-step (lxxi) of repeating sub-steps (lvii) to (lxx) one or more times.

14. The method of claim 12 wherein first half stack comprises further layers with step (C) further comprising sub-step (xx) of repeating sub-steps (vii) to (xix) one or more times, and said second half stack comprises further layers with step (I) further comprising sub-step (lxx) of repeating sub-steps (lvii) to (lxix) one or more times.

15. The method of claim 10 wherein said adhesion metal is selected from the list of titanium, chrome and nickel/chrome alloy.

16. The method of claim 10, wherein sub-step of thinning the insulative material to expose copper therebeneath comprises thinning by a process selected from the group consisting of dry etching, mechanical grinding, chemical mechanical polishing (CMP), combinations and two stage processes thereof.

17. The method of claim 15 further comprising a post thinning cleaning step to remove polymer smear from copper surface.

18. The method of claim 1 wherein at least one of said insulating layers comprises a matrix material comprising a polymeric resin selected from the group consisting of thermoplastics, thermosets and mixtures thereof.

19. The method of claim 18 wherein at least one of said insulating layers further comprises at least one of:
(a) inorganic particulate fillers having mean particle size of between 0.5 microns and 5 microns and between 15% and 30% of particulate by weight; and
(b) fibers selected from the group consisting of organic fibers and glass fibers, arranged in an arrangement selected from the group consisting of cross-plied arrangements, woven mats and randomly oriented chopped fibers.

20. The method of claim 18 wherein at least one of said insulating layers is provided as a prepreg that is applied over copper layers and/or vias by a hot press lamination process.

21. The method of claim 2 wherein step (L) of applying termination layers to outer surfaces comprises the sub-steps of:
(m) thinning substrate to expose copper vias in outermost layers;
(n) depositing outer adhesion metal layers onto exposed copper vias;
(o) depositing outer copper seed layers onto the outer adhesion metal layers;
(p) applying outer photoresist layers to the outer copper seed layers;
(q) exposing and developing outer photoresist layers to provide a patterned structure;
(r) depositing copper within the patterned structure to form copper conductors and pads;
(s) removing the outer photoresist layers;

(t) removing the outer adhesion layers and outer copper seed layers;
(u) applying solder mask layers to both sides of the stack;
(v) selectively removing solder mask to expose copper pads, and
(w) applying a final coating selected from the list of nickel, gold, tin, lead, silver, palladium and alloys or amalgams thereof and organic anti-tarnish finishes.

22. The method of claim 2 wherein step (L) of applying termination layers to outer surfaces comprises the sub-steps of:
(m) thinning substrate to expose copper vias in outermost layers;
first: depositing outer adhesion metal layers;
second: depositing outer copper layers to required thickness;
third, applying and developing outer photoresist layers;
fourth, selectively etching away outer copper layers thereby exposing outer adhesion metal layers and forming copper conductors and pads;
fifth, stripping away the outer photoresist layers;
sixth, removing exposed outer adhesion layers and copper seed layers;
seventh, applying solder mask layers to both sides of the stack;
eighth, selectively remove solder mask to expose the copper pads, and
ninth, applying a final coating selected from the list of nickel, gold, tin, lead, silver, palladium and alloys or amalgams thereof and organic anti-tarnish finishes.

23. An electronic substrate formed by the method of claim 1.

24. An electronic substrate according to claim 1, comprising a multilayer, coreless laminate having a substantially symmetrical lay up of alternating conductive layers and insulative layers; the conductive layers comprising metallic materal; the insulative layers comprising polymeric matrix materials; wherein solid metal vias are provided through the insulative layers to connect the conducting layers; the structure being substantially flat and free standing.

25. The electronic substrate of claim 23 having at least one of the following limitations:
(I) the conducting layers are fabricated from copper and the insulative layers are fabricated from a polymeric matrix material;
(II) at least one insulative layer further comprises between 15% and 30% by weight of particulate filler, and
(III) at least one insulative layer further comprises fibers.

26. The electronic substrate of claim 23 configured as an interconnect structure for interconnecting an integrated circuit with a printed circuit board.

27. The method of claim 18, wherein the polymeric resin is selected from the group consisting of poly(tetrafluoroethylene), derivatives of poly(tetrafluoroethylene), bismaleimide triazine resins, epoxy resins, polyimide resins and mixtures thereof.

28. A method of fabricating an electronic substrate comprising the steps of fabricating a full stack by:
(A) selecting a first base layer;
(B) depositing a first etchant resistant barrier layer onto said first base layer;
(C) building up a first half stack of alternating conductive layers and insulating layers, the conductive layers being interconnected by vias through the insulating layers, comprising the sub-steps of:
(i) depositing a copper seed layer;
(ii) applying a first photoresist layer onto said copper seed layer;
(iii) exposing and developing said first photoresist layer to form a pattern;
(iv) pattern electroplating copper inside the pattern to form a first copper via layer;
(v) stripping away the first photoresist layer;
(vi) applying a first polymeric insulating material layer;
(vii) thinning down the polymeric insulating material layer to expose first copper via layer;
(viii) depositing a first adhesion metal layer;
(ix) depositing a second copper seed layer;
(x) applying a second photoresist layer onto said second copper seed layer;
(xi) exposing and developing said second photoresist layer to form a pattern of features;
(xii) pattern electroplating copper inside the pattern of features in second photoresist layer to form a first copper feature layer;
(xiii) stripping away said second photoresist layer;
(xiv) applying a third photoresist layer;
(xv) exposing and developing said third photoresist layer to form a second via pattern;
(xvi) depositing copper into second via pattern to form a second copper via layer;
(xvii) stripping away third photoresist layer and exposing said copper features, second copper vias and second copper seed layer;
(xviii) removing said second copper seed layer thus exposed;
(xix) removing said first adhesion metal layer, and
(xx) applying a second polymeric insulative material layer over the copper features and vias thus exposed;
(D) applying a second base layer onto said first half stack;
(E) applying a protective coating of photoresist to said second base layer;
(F) etching away said first base layer;
(G) removing the protective coating of photoresist;
(H) removing said first etchant resistant barrier layer;
(I) building up a second half stack of alternating conductive layers and insulating layers, the conductive layers being interconnected by vias through the insulating layers, wherein second half stack has a substantially symmetrical lay up to first half stack;
(J) applying an insulating layer onto said second half stack of alternating conductive layers and insulating layers, and
(K) removing said second base layer.

29. A method of fabricating an electronic substrate comprising the steps of fabricating a full stack by:
(A) selecting a first base layer;
(B) depositing a first etchant resistant barrier layer onto said first base layer;
(C) building up a first half stack of alternating conductive layers and insulating layers, the conductive layers being interconnected by vias through the insulating layers, comprising the sub-steps of:
(i) depositing a copper seed layer;
(ii) applying a first photoresist layer onto said copper seed layer;
(iii) exposing and developing said first photoresist layer to form a pattern;
(xii) pattern electroplating copper inside the pattern of features in first photoresist layer to form a first copper feature layer;
(xiii) stripping away first photoresist layer;
(xiv) depositing a second photoresist layer;

(xv) exposing and developing said second photoresist layer to form a via pattern;
(xvi) depositing copper into via pattern to form a copper via layer;
(xvii) stripping away second photoresist layer and exposing copper features, second copper vias and second copper seed layer;
(xviii) removing said second copper seed layer thus exposed;
(xix) removing said first adhesion metal layer, and
(xx) applying a polymeric insulative material layer over the copper features and vias thus exposed;
(D) applying a second base layer onto said first half stack;
(E) applying a protective coating of photoresist to said second base layer;
(F) etching away said first base layer;
(G) removing the protective coating of photoresist;
(H) removing said first etchant resistant barrier layer;
(I) building up a second half stack of alternating conductive layers and insulating layers, the conductive layers being interconnected by vias through the insulating layers, wherein second half stack has a substantially symmetrical lay up to first half stack;
(J) applying an insulating layer onto said second half stack of alternating conductive layers and insulating layers, and
(K) removing said second base layer.

30. An electronic substrate formed by the method of claim 28.

31. An electronic substrate according to claim 28, comprising a multilayer, coreless laminate having a substantially symmetrical lay up of alternating conductive layers and insulative layers; the conducting layers comprising metallic materal; the insulative layers comprising polymeric matrix materials; wherein solid metal vias are provided through the insulative layers to connect the conducting layers; the structure being substantially flat and free standing.

32. The electronic substrate of claim 30 having at least one of the following limitations:
(I) the conducting layers are fabricated from copper and the insulative layers are fabricated from a polymeric matrix material;
(II) at least one insulative layer further comprises between 15% and 30% by weight of particulate filler, and
(III) at least one insulative layer further comprises fibers.

33. The electronic substrate of claim 30 configured as an interconnect structure for interconnecting an integrated circuit with a printed circuit board.

34. An electronic substrate formed by the method of claim 29.

35. An electronic substrate according to claim 29, comprising a multilayer, coreless laminate having a substantially symmetrical lay up of alternating conductive layers and insulative layers; the conductive layers comprising metallic materal; the insulative layers comprising polymeric matrix materials; wherein solid metal vias are provided through the insulative layers to connect the conducting layers; the structure being substantially flat and free standing.

36. The electronic substrate of claim 34 having at least one of the following limitations:
(I) the conducting layers are fabricated from copper and the insulative layers are fabricated from a polymeric matrix material;
(II) at least one insulative layer further comprises between 15% and 30% by weight of particulate filler, and
(III) at least one insulative layer further comprises fibers.

37. The electronic substrate of claim 34 configured as an interconnect structure for interconnecting an integrated circuit with a printed circuit board.

* * * * *